United States Patent [19]
Watanabe

[11] Patent Number: 5,880,494
[45] Date of Patent: Mar. 9, 1999

[54] ACTIVE TYPE PHOTOELECTRIC CONVERTING DEVICE AND AN ACTIVE TYPE SOLID-STATE IMAGING DEVICE USING THE SAME

[75] Inventor: Takashi Watanabe, Soraku-gun, Japan

[73] Assignee: Sharp Kabushiki Kaisha, Japan

[21] Appl. No.: 382,257

[22] Filed: Feb. 1, 1995

[30] Foreign Application Priority Data

Jun. 29, 1994 [JP] Japan ..................................... 6-148330
Dec. 7, 1994 [JP] Japan ..................................... 6-303953

[51] Int. Cl.⁶ .................................................. H01L 27/148
[52] U.S. Cl. .......................... 257/225; 257/229; 257/291
[58] Field of Search .................................. 257/225, 230, 257/290, 291, 292, 293, 229

[56] References Cited

U.S. PATENT DOCUMENTS

| | | | |
|---|---|---|---|
| 4,498,013 | 2/1985 | Kuroda et al. | 257/230 |
| 5,027,177 | 6/1991 | Vasudev | 257/290 |
| 5,208,476 | 5/1993 | Inoue | 257/408 |
| 5,235,197 | 8/1993 | Chamberlain et al. | 257/230 |
| 5,286,987 | 2/1994 | Watanabe | 257/221 |
| 5,324,669 | 6/1994 | Kuroda et al. | 437/3 |
| 5,488,251 | 1/1996 | Mizutani et al. | 257/557 |
| 5,500,383 | 3/1996 | Hynecek | 437/53 |
| 5,567,632 | 10/1996 | Nakashiba et al. | 437/3 |
| 5,572,051 | 11/1996 | Arakawa et al. | 257/225 |

OTHER PUBLICATIONS

Gaffney et al. "Preventing Overload In Optical Scanners," I.B.M. Tech. Disc. Bull., vol. 17, No. 8, pp. 3529–3530; May 1975.

C. Nakamura et al., *Television Academy*, p. 57, 1986, "Gate accumulation type MOS Phototransistor•Image Sensor".

J. Hynecek, *IEEE Transaction on Electron Devices*, vol. 35, No. 5, May 1988, "A New Device Architecture Suitable for High–Resolution and High–Performance Image Sensors".

J. Hynecek, *IEEE Transactions on Electron Devices*, vol. 38, No. 5, May 1991, "BCMD–An Improved Photosite Structure for High–Density Image Sensors".

T. Nakamura et al., *JEDM 86*, 1986, "A New MOS Image Sensor Operating in a Non–Destructive Readout Mode".

*Primary Examiner*—Olik Chaudhuri
*Assistant Examiner*—Nathan K. Kelley
*Attorney, Agent, or Firm*—David G. Conlin; Dike, Bronstein, Roberts & Cushman, LLP

[57] ABSTRACT

An active type photoelectric converting device includes: a transistor formed in a surface region of a semiconductor body, the transistor accumulating signal charges generated by light incident on the transistor at the surface region of the semiconductor body in the transistor, and outputting variation of an electric signal in response to variation of the accumulated signal charges; and a first gate region including a portion of the semiconductor body, a first insulating film formed on the portion of the semiconductor body, and a first gate electrode formed the first insulating film; the gate region, provided adjacent to the transistor, for transferring the accumulated signal charges from the surface region of the semiconductor body into an inside of the semiconductor body in response to a voltage applied to the first gate electrode.

27 Claims, 35 Drawing Sheets

Cross section along the line 2B-2B

Cross section along the line 2A-2A

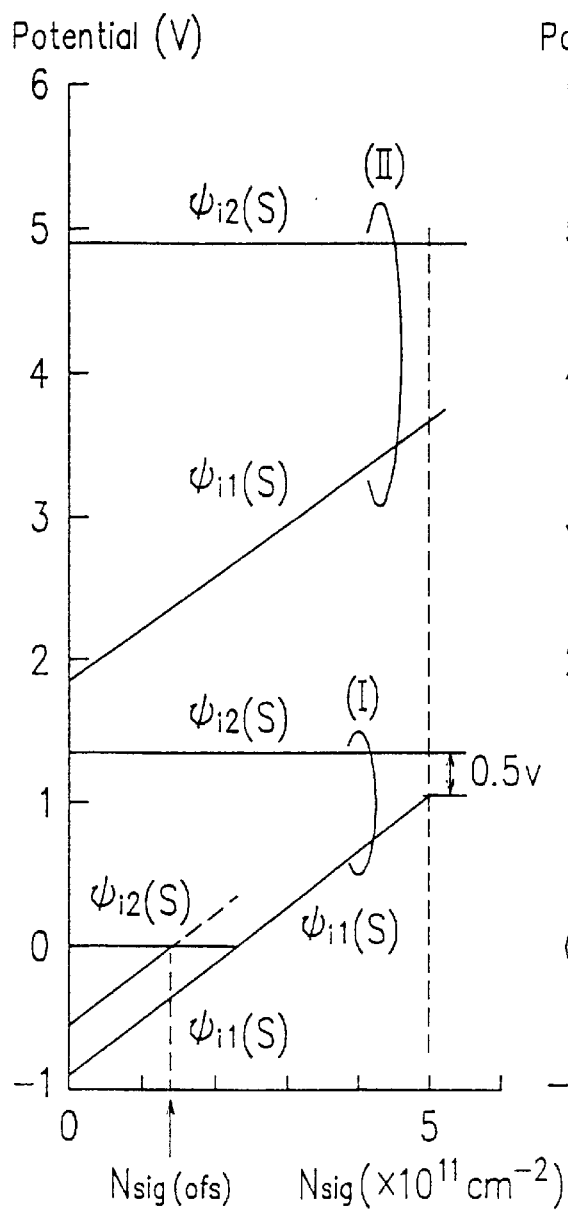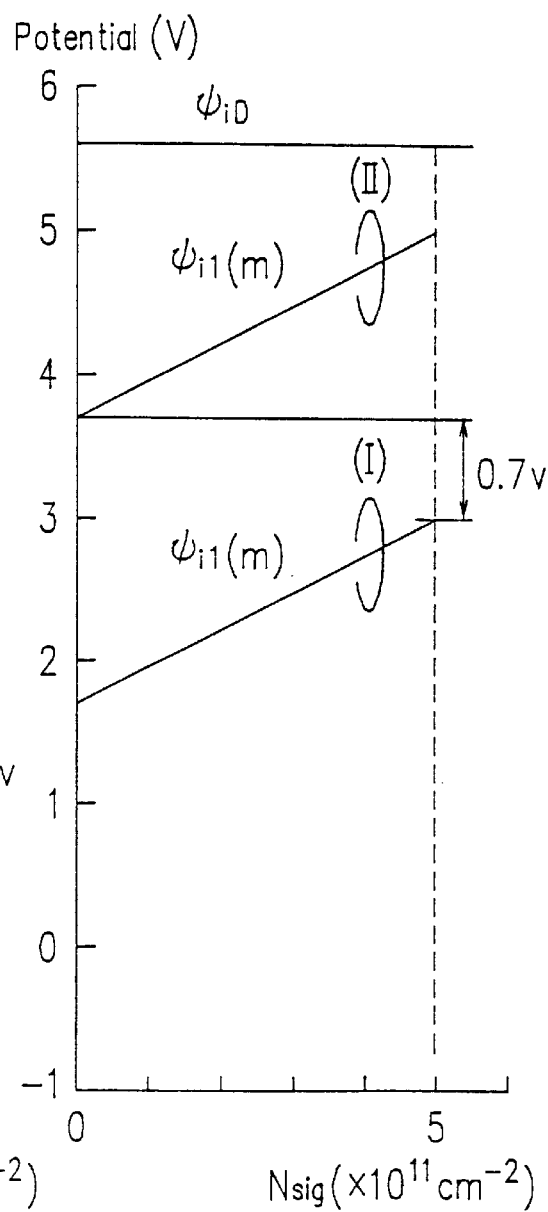

(1) $V_B(i-1)$ (2) $V_A(i-1)$ (3) Signal reading | Reset | Signal charge accumulation $V_B(i)$ (4) $V_A(i)$ (5) $V_B(i+1)$ (6) $V_A(i+1)$ (7) OS (i-1) row | i row | (i+1) row Horizontally blanking period Horizontally scanning period (1H)

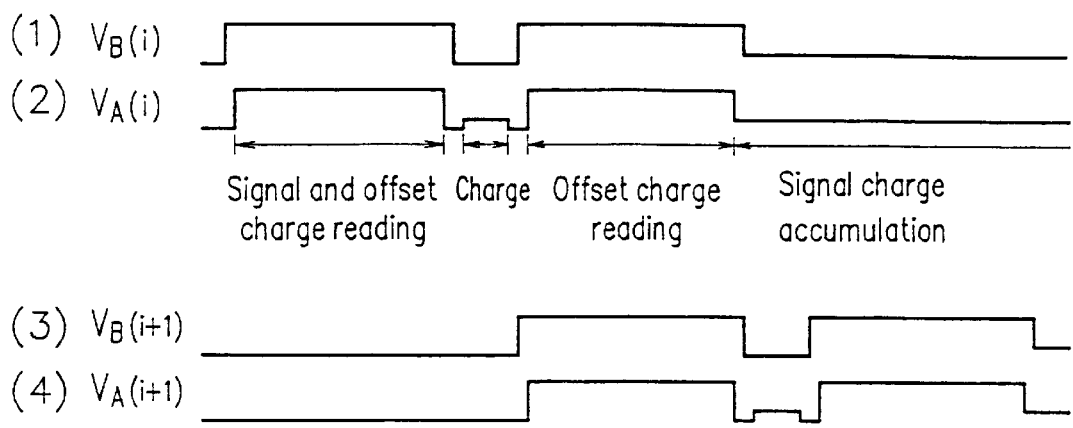

Cross section along
the line 16A-16A

Cross section along
the line 16B-16B

ACTIVE TYPE PHOTOELECTRIC CONVERTING DEVICE AND AN ACTIVE TYPE SOLID-STATE IMAGING DEVICE USING THE SAME

BACKGROUND OF THE INVENTION

1. Field of the Invention

The present invention relates to an active type solid-state imaging device using a metal-oxide-semiconductor (hereinafter, referred to as MOS), field-effect transistor (herein after, referred to as FET), or a junction gate FET. More particularly, to an active type solid-state imaging device which can realize an excellent performance and a lower driving voltage.

2. Description of the Related Art

A charge-coupled device (CCD) type solid-state imaging device has been widely used in various fields as a featuring device of a solid-state imaging device. In a CCD type imaging device; signal charges, which are photoelectrically-converted and accumulated by a photodiode or an MOS diode, are transferred via a CCD transferring channel to a high-sensitivity charge detection portion and converted there into voltage signals. That is why, the CCD type imaging device has a higher S/N ratio and a larger output voltage.

However, in order to meet the demand that such an imaging device should be smaller-sized and have a larger number of pixels, the size of a pixel to be used should be smaller and the amount of charges that can be transferred by a CCD should be reduced. Consequently, there have occurred serious problems such as a scale-down of the dynamic range, a remarkable increase of the power consumption, and the like. Because a larger amount of load capacity and a higher driving voltage are required to drive the entire CCD device by several phases of clocks, a larger number of pixels requires a larger amount of power.

In order to solve these problems, an active type imaging device is proposed in which signal charges generated in respective pixels are not read out by themselves, but read out by a scanning circuit after the signals charges have been amplified in the respective pixels. Such a device eliminates the limit of the amount of the signals to be read out, and makes a dynamic range broader than that of a CCD type imaging device. Moreover, in such a device, since the signals are read out by driving the pixels to be read out only in a horizontal and a perpendicular line and with a lower voltage, a smaller amount of power consumption is required than that of a CCD type imaging device.

In such a device, a transistor is generally employed to amplify the signals in a pixel, therefore an SIT type, a bipolar type, an FET type (an MOS type or a junction type), and the like have been proposed. Since it is generally easier to employ MOSFETs as a scanning circuit, considering the configuration of the device, it is more advantageous to use an FET type pixels. More preferably, it is advantageous to use a device in which only a single FET is contained inside a pixel in order to increase the pixel density. A charge modulation device (CMD) type, a floating gate array (FGA) type, and a bulk charge modulation device (BCMD) type have been reported as an active type imaging device.

FIGS. 32A and 32B show CMD type pixels of a conventional active type solid-state imaging device, in which a plurality of pixels are arranged in a matrix, as shown in these figures. FIG. 32A is a plan view of the pixels, and FIG. 32B is a cross-sectional view taken along a line L—L in FIG. 32A. FIG. 33 shows a distribution of the potentials in a perpendicular direction taken along a line M—M in FIG. 32B. These FIGS. 32A, 32B and 33 are shown in Nakamura et al., "Gate-accumulation type MOS phototransistor image sensor", 1986 Television Academy, p. 57. As is apparent from FIGS. 32A and 32B, an n-well 2 is formed as a buried channel in a p-substrate 1. A gate electrode 3 is formed on the n-well 2 interposing an insulating film 6. A source region 4 and a drain region 5 composed of a highly-concentrated n-layer and separated by the n-well 2 are formed in the n-well 2. The gate electrodes 3 of the respective pixels are connected in common to gate terminals 7 in a horizontal direction, and the respective source regions 4 are connected in common to source terminals 8 in a vertical direction.

An operation of the CMD type pixel will be described with reference to FIG. 33. First, at the time of signal accumulation, a gate voltage is set to be a voltage $V_L$ and signal charges (holes) generated by photoelectric conversion are accumulated in an interface between the semiconductor and the insulating film. Then, at the time of signal reading, the gate voltage is set to be a voltage $V_M$ which is a higher potential than the voltage $V_L$ and a current between the source and the drain regions 4 and 5 varies in accordance with the amount of the signal charges. The varied value of the current is read out as a signal output. The other pixels on the same source terminal 8 are not detected because the gate voltage is in a $V_L$ level. At the time of the resetting operation, by which signal charges are cleared to be ready for the next signal accumulation, the gate voltage is set to be a voltage $V_H$, so that the potential in the substrate decreases along a direction perpendicular to the substrate. The signal charges (holes) accumulated in the interface between the n-well 2 and the insulating film 6 are then discharged into the substrate 1 under the interface, as shown by the broken lines in FIG. 32B.

A conventional CMD type imaging device has following shortcomings. First, the gate voltage at the time of the resetting operation must be very high because the concentration of the impurity in the buried n-well channel layer should be set to be high so that the density of the accumulated signal charges may be high. For example, a case of employing the following Condition 1 will be analyzed. This Condition 1 will be cited again in the examples of the present invention described later.

[Condition 1]
Concentration of the substrate: $N_P=1.0\times10^{15}$ cm$^{-3}$
Concentration of the n-layer: $N_N=3.0\times10^{15}$ cm$^{-3}$
Thickness of the n-layer: $d_N=1.5$ $\mu$m
Thickness of the gate insulating film: $d_O=80$ nm Using this condition, the condition where the potential decreases linearly from the surface of the n-well 2 to the p-substrate 1 is expressed as follows:

$$V_G = \frac{qN_N}{2K_S\epsilon_0}\left(1+\frac{N_N}{N_P}\right)d_N^2 - V_{FB} \quad \text{[Equation 1]}$$

$$= 20.88 - 0.85 = 20.03 \text{ V}$$

As a result, the gate voltage $V_H$ required for the resetting operation is 20.0 V if a flat band voltage $V_{FB}$ is −0.85 V, so the gate voltage $V_H$ is an impractical value.

In a conventional CMD type imaging device, another problem occurs that the depletion of the interface between the n-well 2 and the insulating film 6 causes the generation of a considerable dark current.

An FGA type imaging device is employed among the FET type active type imaging devices to reduce the generation of the dark current. FIG. 34A shows a partial plan view of an FGA type imaging device. FIG. 34B shows the cross section of a pixel taken along the line N—N in FIG. 34A, and FIG. 34C shows the potential distributions in a direction taken along the line O—O in FIG. 34B. This prior art shown in these figures is described in J. Hynecek, "A New Device Architecture Suitable for High-Resolution and High-Performance Image Sensor", IEEE Trans. Elec. Dev., p. 646 (1988).

This FGA type device is different from the CMD type device in that a p-layer 9 in a relatively high concentration is provided on the n-well 2 under the gate electrode 3. A gate voltage is set to be $V_L$ at the time of the signal accumulation and the signal reading, and the variation of the channel potential of the n-well layer 2 is detected as a variation of the threshold value in accordance with the accumulation of the signal charges (holes) in the p-layer 9. The other pixels on the same signal line are not detected because the gate voltage is in a $V_L$ level only at the time of the signal reading. In this FGA type device, a similar resetting operation is conducted to that of the CMD type device, i.e. the gate voltage is set to be $V_H$ which makes a potential in the substrate decrease linearly in a direction perpendicular to the substrate. The signal charges (holes) accumulated in the p-layer 9 are discharged into the substrate 1 under the p-layer 9. According to this structure the p-layer 9 is not depleted even at the time of the resetting operation, so the generation of the dark current is reduced. However, if the p-layer 9 is not depleted at the time of the resetting operation, the signal charges are not completely transferred. Consequently, the generation of residual images and the increase of resetting noise cannot be prevented.

A BCMD type device is proposed to improve the defects of the FGA type device in J. Hynecek, "BCMD—An Improved Photosite Structure for High Density Image Sensor", IEEE Trans. Elec. Dev., p. 1011 (1991). FIG. 35A shows a cross section of a BCMD type pixel, and FIG. 35B shows potential distributions in a direction taken along a Line P—P of FIG. 35A. In a BCMD type device, a p-layer 11, an n-layer 12 and a p-layer 13 are stacked in this order on an n-substrate 10. And p-layers in a high concentration 14 for a source electrode and a drain electrode are formed so as to reach the p-layer 11 through the n-layer 12 and the p-layer 13.

This BCMD type device is different from the FGA type in the following points:
1) The signal charges are converted into electrons and accumulated in the buried channel n-layer 12.
2) The potential variation of the p-layer 13 caused by the signal charges are detected as a variation of the threshold value of the P-MOS structure.
3) At the time of the resetting operation, the gate voltage is set to be lower ($V_L$) and the signal charges are discharged into the n-substrate 10.

Accordingly, the complete transfer of the signal charges is accomplished. However, the p-n-p-n multi-layered structure of this device makes it difficult to optimize the driving conditions, and makes the fabrication steps complicated.

Moreover, in all the active type imaging devices currently proposed, including the CMD type, the FGA type, and the BCMD type devices, a problem still remains unsolved that the fixed patter n noises (FPNs) generate because of the dispersion of the signal levels and the amplification rates of the respective pixels.

In order to solve the above-mentioned problems, according to the present invention, a novel active type solid-state imaging device is provided in which a wide dynamic range and a driving at a lower voltage are realized by using a simplified structure and the generation of the dark current and the FPN is reduced.

SUMMARY OF THE INVENTION

An active type photoelectric converting device of the invention includes: a transistor formed in a surface region of a semiconductor body, the transistor accumulating signal charges generated by light incident on the transistor at the surface region of the semiconductor body in the transistor, and outputting variation of an electric signal in response to variation of the accumulated signal charges; and a first gate region including a portion of the semiconductor body, a first insulating film formed on the portion of the semiconductor body, and a first gate electrode formed the first insulating film; the gate region, provided adjacent to the transistor, for transferring the accumulated signal charges from the surface region of the semiconductor body into an inside of the semiconductor body in response to a voltage applied to the first gate electrode.

In one embodiment of the invention, the transistor is an MOSFET including a second gate region which has a buried channel structure, and the first gate region having a surface channel structure.

In another embodiment of the invention, the transistor is a junction gate type FET including a second gate region which has a buried channel structure, and the first gate region having a surface channel structure.

In still another embodiment of the invention, the semiconductor body has a first conductivity type, and the transistor includes: a first semiconductor layer of a second conductivity type provided in the surface region of the semiconductor body, the first semiconductor layer including a signal accumulating region for accumulating the signal charges and a channel region serving as a channel for the transistor; a second semiconductor layer and a third semiconductor layer, both provided in a surface region of the first semiconductor layer, the second semiconductor layer and the third semiconductor layer including an impurity of the second conductivity type in a higher concentration than that of the first semiconductor layer, and acting as a source and a drain for the transistor; a second insulating film provided on the first semiconductor layer; and a second gate electrode provided on the second insulating film, whereby the second gate region comprises the first semiconductor layer, the second insulating film, and the second gate electrode.

In still another embodiment of the invention, the semiconductor body has a first conductivity type, and the transistor includes: a first semiconductor layer of a second conductivity type provided in the semiconductor body, the first semiconductor layer including a channel region serving as a channel for the transistor; a second semiconductor layer and a third semiconductor layer, both provided in a surface region of the first semiconductor layer, the second semiconductor layer and the third semiconductor layer including an impurity of the second conductivity type in a higher concentration than that of the first semiconductor layer and acting as a source and a drain for the transistor; and a fourth semiconductor layer of the first conductivity type provided on the first semiconductor layer, the fourth semiconductor layer including a signal charge accumulating region for accumulating the signal charges, whereby the second gate region comprises the first and the fourth semiconductor layers.

In still another embodiment of the invention, the transistor further comprises a third insulating film provided on the fourth semiconductor layer, and a second gate electrode provided on the third insulating film.

In still another embodiment of the invention, a resetting operation of the signal charges of the device is accomplished by controlling at least the voltage applied to the first gate electrode, and discharging the signal charges accumulated in the surface region of the semiconductor body in the transistor into the inside of the semiconductor body via the first gate region.

In still another embodiment of the invention, in a case where excessive signal charges of more than a predetermined amount are accumulated in the surface region of the semiconductor body in the transistor, a blooming suppression operation of the device is accomplished by controlling at least the voltage applied to the first gate electrode and discharging the excessive signal charges into the semiconductor body via the first gate region.

In still another embodiment of the invention, an offset adding operation of the device is accomplished by controlling at least the voltage applied to the first gate electrode, and injecting offset charges from the inside of the semiconductor body into the surface region of the semiconductor body in the transistor via the first gate region.

In still another embodiment of the invention, a differential signal is output by subtracting an output signal of an sum of the injected offset charges and the charges accumulated in the surface region of the semiconductor body in the transistor by a photoelectric conversion from an output signal of the injected offset charges alone.

In still another embodiment of the invention, a duration of the signal charge accumulation is controlled in accordance with timings of the resetting operation of the signal charges of the device, and the timings is determined by controlling a voltage applied to the first gate electrode or voltages applied to the first gate electrode and the second gate electrode.

According to another aspect of the invention, a solid-state imaging device comprising a plurality of active type photoelectric converting devices arranged in a surface region of a semiconductor body in one dimensional array or two dimensional array, each of the active type photoelectric converting devices includes: a transistor formed in the surface region of the semiconductor body, the transistor accumulating signal charges generated by light incident on the transistor at the surface region of the semiconductor body in the transistor and outputting variation of an electric signal in response to variation of the accumulated signal charges; and a first gate region including a portion of the semiconductor body, a first insulating film formed on the portion of the semiconductor body, and a first gate electrode formed the first insulating film; the gate region, provided adjacent to the transistor, for transferring the accumulated signal charges from the surface region of the semiconductor body into an inside of the semiconductor body in response to a voltage applied to the first gate electrode.

In one embodiment of the invention, in each of the active type photoelectric converting devices; the first gate region has a surface channel structure, and the transistor is a field effect transistor and includes a second gate region provided adjacent to the first gate region and having a buried channel structure, a source region, and a drain region, and wherein the second gate region is surrounded by the drain region and the first gate region, and each of the active type photoelectric converting devices is isolated from adjacent ones by at least one of the drain region and the first gate region.

In another embodiment of the invention, the plurality of the active type photoelectric converting devices are arranged in an array along a first direction, wherein in each of the active type photoelectric converting devices; the first gate region has a surface channel structure, the transistor is a field effect transistor and includes a second gate region provided adjacent to the first gate region and having a buried channel structure, a source region and a drain region, the transistor shares the source region with a transistor of a first active type photoelectric converting device adjacent to the active type photoelectric converting devices in a side, and shares the drain region and the first gate region with a transistor of a second active type photoelectric converting device adjacent to the amplifying type photoelectric converting devices in the other side.

In still another embodiment of the invention, the plurality of the active type photoelectric converting devices are arranged in a two dimensional array along the first and a second direction, and wherein the drain region is further shared with a transistor of an active type photoelectric converting device in a side adjacent to the active type photoelectric converting device in the second direction and with a transistor of an active type photoelectric converting device in the side adjacent to the second active type photoelectric converting device, and wherein the first gate region is further shared with a transistor of an active type photoelectric converting device in the other side adjacent to the active type photoelectric converting device in the second direction and with a transistor of an active type photoelectric converting device in the other side adjacent to the second active type photoelectric converting device.

In still another embodiment of the invention, the plurality of the active type photoelectric converting devices is MOSFETS, respectively.

In still another embodiment of the invention, the plurality of the active type photoelectric converting devices is junction gate FETS, respectively.

In still another embodiment of the invention, the first gate region includes a portion of the semiconductor body, a first insulating film formed on the portion of the semiconductor body, and a first gate electrode formed on the first insulating film, and wherein the transistor includes a first semiconductor layer of a second conductivity type, provided adjacent to the first gate region in the surface region of the semiconductor body, the source region and the drain region are formed in the first semiconductor layer the second gate region includes a portion of the first semiconductor layer, a second gate insulating film formed on the portion of the first semiconductor layer, and a second gate electrode formed on the second gate insulating film.

In still another embodiment of the invention, the semiconductor body has a first conductivity type, wherein the first gate region includes a portion of the semiconductor body, a first insulating film formed on the portion of the semiconductor body, and a first gate electrode formed on the first insulating film, wherein the transistor includes a first semiconductor layer of a second conductivity type, provided adjacent to the first gate region in the surface region of the semiconductor body, a second and a third semiconductor layer formed in a surface region of the first semiconductor layer and acting as a source region and the drain region, respectively, and wherein the second gate region includes a portion of the first semiconductor layer and a fourth semiconductor layer of the first conductivity type, provided in a portion of the first semiconductor layer.

In still another embodiment of the invention, the transistor further includes a third insulating film formed on the fourth semiconductor layer and a second gate electrode formed on the third insulating film.

In still another embodiment of the invention, the second gate electrode have a first sub-electrode formed along the second semiconductor layer and a second subelectrode formed along the third semiconductor layer.

In still another embodiment of the invention, the solid-state imaging device further includes: first clock lines for electrically connecting the respective first gate electrodes of the plurality of the active type photoelectric converting devices; second clock lines for electrically connecting the respective second gate electrodes of the plurality of the active type photoelectric converting devices; and signal lines for electrically connecting the respective second semiconductor layers of the plurality of the active type photoelectric converting devices, wherein a prescribed voltage is applied to the respective third semiconductor layers of the plurality of the active type photoelectric converting devices.

In still another embodiment of the invention, the solid-state imaging device further includes: first clock lines for electrically connecting the respective first gate electrodes of the plurality of the active type photoelectric converting devices; second clock lines for electrically connecting the respective third semiconductor layers of the plurality of the active type photoelectric converting devices; and signal lines for electrically connecting the respective second semiconductor layers of the plurality of the active type photoelectric converting devices.

In still another embodiment of the invention, the first gate region of each of the active type photoelectric converting devices has a base portion and a branch portion extending from the base portion along the first direction, the source region and the second gate region are respectively isolated by the branch portion from those of the adjacent active type photoelectric converting device in the second direction.

In still another embodiment of the invention, the base portion of the first gate electrode is interposed between the drain regions of two adjacent active type photoelectric converting devices in the second direction, and an arranged cycle of the base portion and the drain region is shifted by a half of the cycle to that of the second gate region in the second direction.

In still another embodiment of the invention, an arranged cycle of the base portion and the drain region in the second direction is shifted by one cycle to that of the base portion and the drain region of the adjacent active type photoelectric converting device in the first direction.

In still another embodiment of the invention, the first gate electrode, the drain region, and the second gate electrode of each of the active type photoelectric converting devices are electrically connected to the respective ones of the adjacent active type photoelectric converting device in the second direction, and the source region is electrically connected to that of the adjacent active type photoelectric converting device in the first direction.

According to still another aspect of the invention, a method for an active type photoelectric converting device is provided. The method includes the steps of: forming a gate insulating film on a surface of a semiconductor body of a first conductivity type; forming a first gate electrode on the gate insulating film using a photoresist pattern as a mask; forming a semiconductor layer in the semiconductor body in self alignment with the first gate electrode and the photoresist pattern by implanting impurities of a second conductivity type into the semiconductor body using the first gate electrode and the photoresist pattern; forming a first semiconductor layer in the semiconductor body; and forming a source region and a drain region in the semiconductor body, thereby forming a transistor including the first semiconductor layer and acting as a photoelectric converting device.

According to the present invention, the resetting operation can be conducted at a lower voltage by the following steps: the charges generated by the photoelectric conversion, serving as a small number of carriers in the buried channel of the second gate region, are blocked by the barrier formed by the potential slope in the middle of the buried channel and the first gate region, and accumulated in the vicinity of the surface of the photoelectric converting region. An sensor output showing the variation of the characteristics of the embedded channel of the second gate region is obtained from the charges. And then the accumulated signal charges are discharged into the substrate by lowering the barrier formed in the first gate region.

Moreover, a blooming suppression function can be provided in which excessive signal charges in the vicinity of the surface of the photoelectric converting region are discharged into the substrate by setting the barrier in the first gate region at an appropriate value during the signal accumulation period.

In addition, a certain amount of charges (offset charges) can be injected from the substrate into the surface region of the semiconductor if the potential in the vicinity of the surface of the semiconductor is set to be at a lower value than that of the substrate, and the barrier in the first gate region is eliminated after the resetting operation is over. Accordingly, the surface is not depleted and the generation of the dark current is reduced even when it is dark. Furthermore, the dispersion of the gains in respective pixels, the major cause for the generation of the FPN, is generally significant at a lower signal level, however, such dispersion can be reduced by adding the offset charges, thereby improving the FPN effect.

Furthermore, in the case where the solid state imaging device is formed by arranging the solid-state imaging element of the invention in one dimensional array or two dimensional array, sharing the source region with vertically adjacent pixels improves a numerical aperture in the vertical direction. Also, by arranging the first gate region and the drain region alternately, sharing the regions with four pixels, and extending the branch portion so as only to isolate the horizontally adjacent pixels, a numerical aperture in the horizontal direction is improved. Accordingly, sharing the source region, the drain region, and the first gate region with the adjacent pixels can reduce the proportion of area which does not contribute photoelectric conversion to the entire area of the device. Moreover, these regions having hexagonal shapes, enable formation of the contact holes through which wiring can easily and surely connect to these region.

Thus, the invention described herein makes possible the advantage of (1) providing an active type solid-state imaging device in which an resetting operation can be conducted even when the density of the charges is increased. Because the first gate region is added to the second gate region for the photoelectric conversion and accumulation, the signal charges accumulated in the vicinity of the surface of the semiconductor of the second gate region can be discharged via the first gate region into the substrate by varying the potential barrier in the first gate region. Furthermore, the present invention makes possible the advantage of (2) providing a blooming suppression function in which the excessive signal charges in the vicinity of the surface of the semiconductor are discharged into the substrate, or a shutter operation function in which all the signal charges generated by the incident light are discharged during a predetermined period of the optical integration period, by setting the barrier in the first gate region at an appropriate value during the signal accumulation period.

Moreover, according to the present invention, (3) a certain amount of charges (offset charges) can be injected from the substrate into the semiconductor device region, if the potential in the vicinity of the surface of the semiconductor is set to be at a lower value than that of the substrate and the barrier in the first gate region is eliminated after the resetting operation is over. Accordingly, the surface is not depleted and the generation of the dark current is reduced even when it is dark. Also, the dispersion of the gains of respective pixels which is the major cause of the FPN, is generally significant at a lower signal level, however, such dispersion can be reduced by adding the offset charges, thereby improving the FPN effect.

In addition, the second gate region of the imaging device of this invention can be broadly applied to a junction gate FET as well as to an MOSFET. And any type of FET can be easily produced by employing an ordinary MOS process.

These and other advantages of the present invention will become apparent to those skilled in the art upon reading and understanding the following detailed description with reference to the accompanying figures.

BRIEF DESCRIPTION OF THE DRAWINGS

FIG. 2A shows a potential distribution during a signal accumulation operation; FIG. 2B shows a signal detection operation; FIG. 2C shows a potential distribution during a resetting operation; and FIG. 2D shows a potential distribution during an injection operation of the offset charges.

FIGS. 4A and 4B are graphs showing the variations of the potentials in accordance with those of the amount of the signal charges in the operational state as is shown in FIGS. 2A to 2D.

FIG. 11 is timing charts showing examples of the driving timings of the two-dimensional image sensor using the active type solid-state imaging device of FIG. 1 when an injection operation of the offset charges is conducted.

FIG. 16A shows a potential distribution during a resetting operation; FIG. 16B shows potential distributions during a signal accumulation and a detection operation.

FIG. 25A shows a potential distribution during a signal accumulation operation; FIG. 25B shows a signal detection operation; FIG. 25C shows a potential distribution during a resetting operation.

DESCRIPTION OF THE PREFERRED EMBODIMENTS

Hereinafter, the present invention will be described by way of illustrative examples with reference to the accompanying drawings.

Figure 1:
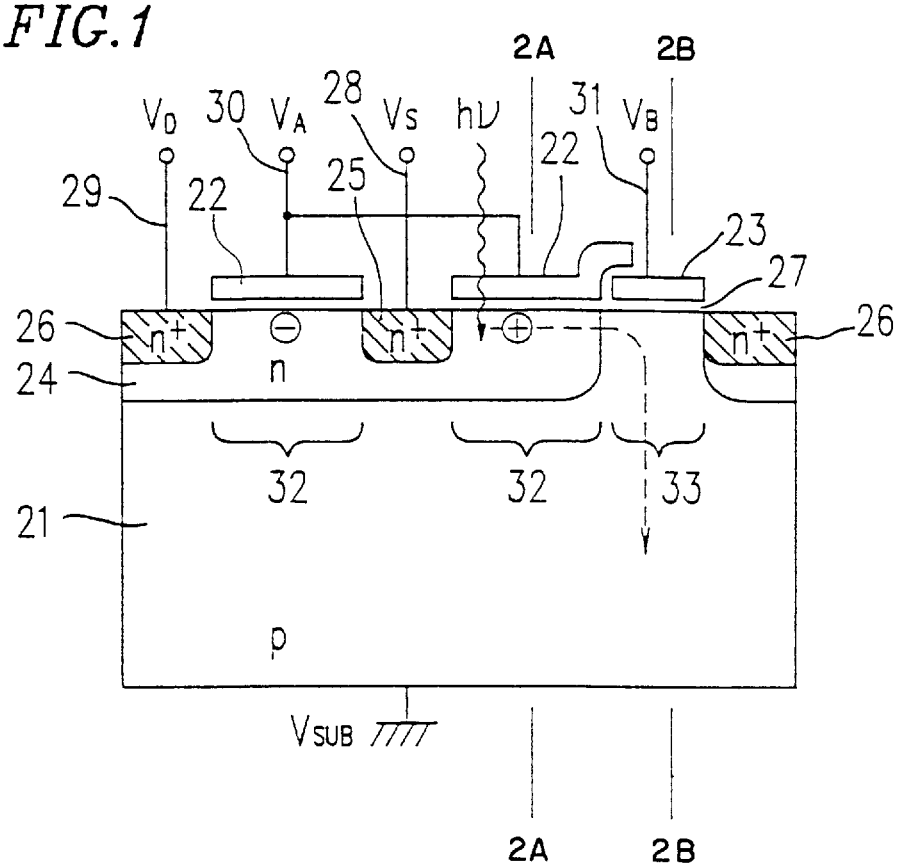
FIG. 1 is a cross-sectional view showing a pixel unit of the active type solid-state imaging device according to the present invention which employs an MOSFET for a photoelectric converting element.

FIG. 1 is a cross-sectional view showing an example of a pixel unit of an active type solid-state imaging device according to the present invention. The imaging device employs an MOSFET as a transistor for a photoelectric converting element. A second gate electrode 22 and a first gate electrode 23 are formed on an p-type semiconductor substrate 21 interposing an insulating film 27 therebetween. An n-layer 24 is formed in a surface region of the semiconductor substrate 21 under the second gate electrode 22, and source region 25 and a drain region 26 both consisting of the n$^+$ diffusion layer are formed in the n-layer 24. The second gate electrode 22, the source region 25, and the drain region 26 compose the MOSFET. As is shown in FIG. 1, the source region 25 is connected in common to a source terminal ($V_S$) 28 and the drain region 26 is connected in common to a drain terminal ($V_D$) 29 in each of the pixels.

Light hυ incident through the second gate electrode 22 generates an electron-hole pair by the photoelectric conversion, while the electrons flow into the drain region 26. The holes are collected by a barrier formed in the middle of the n-layer 24 and a barrier formed under the first gate electrode 23 and turned into the signal charges accumulated in the interface between the insulating layer 27 and the n-layer 24.

The amount of the variation of the potential in the n-layer 24 in accordance with the amount of the signal charges is detected as a variation of the potential at the source region 25 and regarded as an output signal. The signal charges are easy to be discharged along the route shown by the broken line in FIG. 1 into the p-substrate 21 by lowering the potential barrier under the first gate electrode 23.

FIGS. 2A to 2D show potential distributions in a direction perpendicular to the p-substrate 21 shown in FIG. 1 during an operation of the device of FIG. 1. On the right side of these figures, the potential distributions along the line A—A in FIG. 1 are shown and illustrate potential distributions under the second gate electrode 22, and on the left side, those along the line B—B in FIG. 1 are shown and illustrate potential distributions under the first gate electrode 23. The p-substrate 21 is biassed at a potential $V_{sub}$ during the all operation of the device.

Figure 2A:
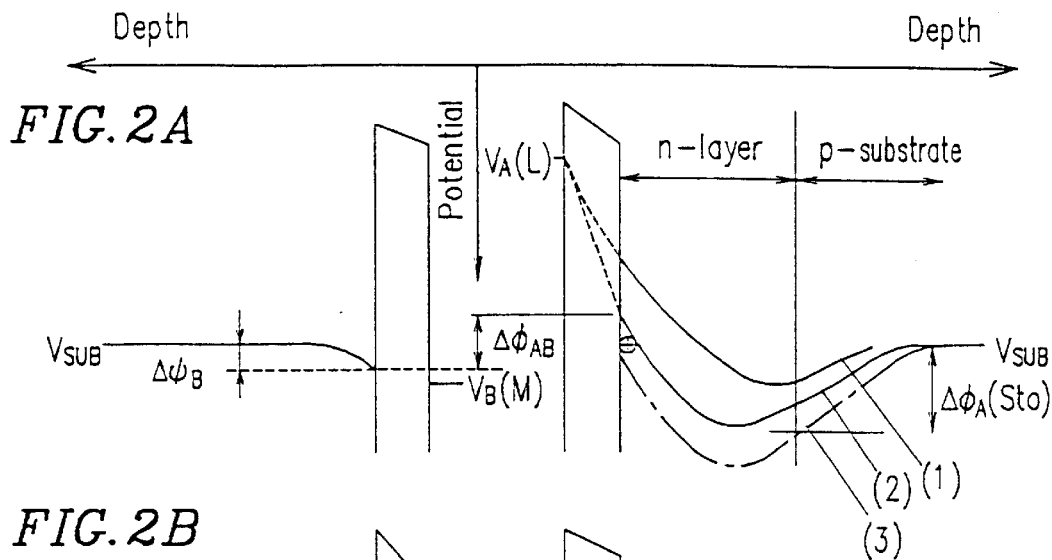
FIGS. 2A to 2D show potential distributions during an operation of the imaging device in directions along the line 2A—2A and the line 2B—2B in FIG. 1.

Specifically, FIG. 2A shows a potential distribution at the time of the signal accumulation. A relatively low voltage $V_A(L)$ is applied to the second gate electrode 22, and a moderate voltage $V_B(M)$, which is higher than the voltage $V_A(L)$ but lower than a voltage $V_A$ (H) mentioned later, is applied to the first gate electrode 23. A potential barrier $\Delta\phi_B$ having a predetermined (approximately 0.5 V in the case where the semiconductor is made of silicon; as in the case described below) value or more against the holes is formed under the first gate electrode 23, and prevents the holes from flowing from the p-substrate 21 into the surface of the n-layer 24. The holes generated by the photoelectric conversion are accumulated as the signal charges at the surface of the n-layer 24, and change the potential distribution illustrated by Line (1) to that illustrated by Line (2) of FIG. 2A. As long as the difference $\Delta\phi_{AB}$ between the surface potential of the n-layer 24 and that under the first gate electrode 23 is large (i.e. $\Delta\phi_{AB}$>0.5 V), the signal charges remain at the surface of the n-layer 24, however, once the difference exceeds the limitation value (i.e. about 0.5 V), the signal charges flow through the potential barrier under the first gate electrode 23 into the substrate 21 (see Line (3) in FIG. 2A).

Consequently, the excessive charges accumulated on the surface of the n-layer 24 can be made to overflow, and the blooming suppression can be conducted. The difference between the highest potential at the n-layer 24 and the potential $V_{sub}$ in the potential distribution shown by Line (2) will be referred to as $\Delta\phi_A$(Sto).

Figure 2B:
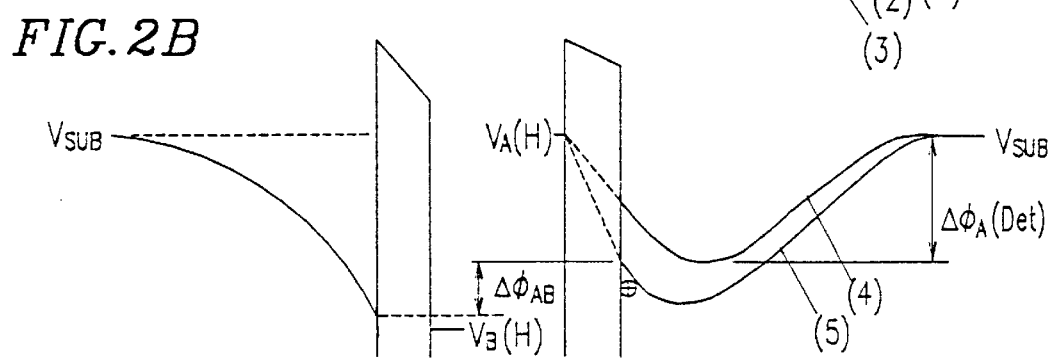

FIG. 2B shows a potential distribution at the time of the signal reading. The potential distribution under the first gate electrode 23 reaches an even higher level by applying a relatively high voltage $V_A(H)$ to the second gate electrode 22. The distribution of the potential when no signal is accumulated is shown by Line (4), and that at the time of the signal accumulation is shown by Line (5) in FIG. 2B. The difference between the highest potential at the n-layer 24 and the potential $V_{sub}$ in the potential distribution shown by Line (4) will be referred to as $\Delta\phi_A$(Det). The value of the voltage $V_A(H)$ is set so that $\Delta\phi_A$(Det)>$\Delta\phi_A$(Sto). Also, a higher voltage $V_B(H)$ than the voltage $V_B(M)$ is applied to the first electrode 23. Under these conditions; a potential barrier, the surface potential of which is deeper than that of the n-layer 24 at the time of the signal accumulation (shown by Line (5) in FIG. 2B) by $\Delta\phi_{AB}$ (>0.5 V), is formed under the first gate electrode 23 and prevents the holes from flowing from the surface of the n-layer 24 into the p-substrate 21. Even if the source terminal $V_S$ shown in FIG. 1 is connected in common to the source regions 25 of a plurality of pixels, in the case where a voltage $V_A(H)$ is applied to a specific gate electrode and with respect to each potential difference, the following equation is satisfied:

$\Delta\phi_A$(Det)>$\Delta\phi_A$(Sto)  [Equation 3]

the value of the source potential to be detected is equal to that of the source terminal $V_S$ when the voltage $V_A(H)$ is applied to the gate electrode.

Figure 2C:
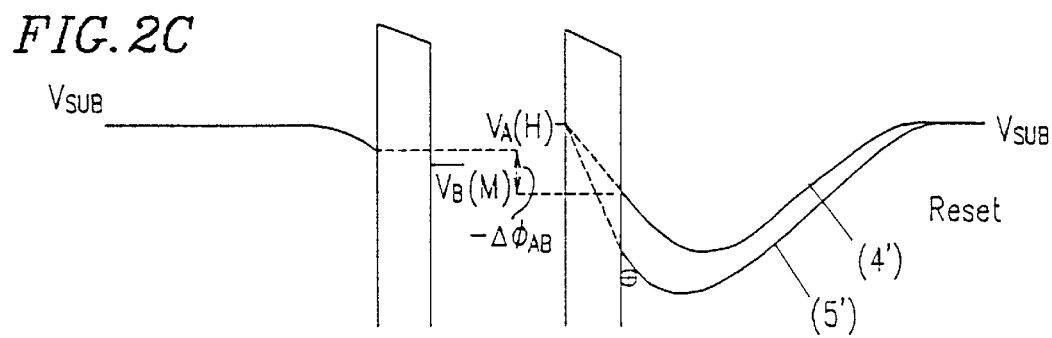

FIG. 2C shows the potential distribution at the time of the resetting operation when the signal charges are discharged.

A relatively high voltage, e.g. a voltage $V_A(H)$ equal to that at the time of the signal reading, is applied to the second gate electrode 22. A moderate voltage, e.g., a voltage $V_B(M)$ equal to that at the time of the signal accumulation, is applied to the first gate electrode 23. At this time, the potential under the first gate electrode 23 is sufficiently lower (i.e. $-\Delta\phi_{AB}$) than the surface potential of the n-layer 24 when no signal is accumulated (shown by Line (4') in FIG. 2C). Accordingly, all the signal charges (holes) at the surface of the n-layer 24 flow below the first gate electrode 23 into the p-substrate 21, that is, the resetting operation is accomplished.

As a result, it is possible to clear all the image information, and then to proceed to the accumulation operation of the following image information. In addition, if the resetting operation is conducted at the middle stage of the optical integration period, all the information that has been accumulated is cleared, and the so-called shutter operation can be conducted for accumulating only the information after the resetting operation.

Figure 2D:
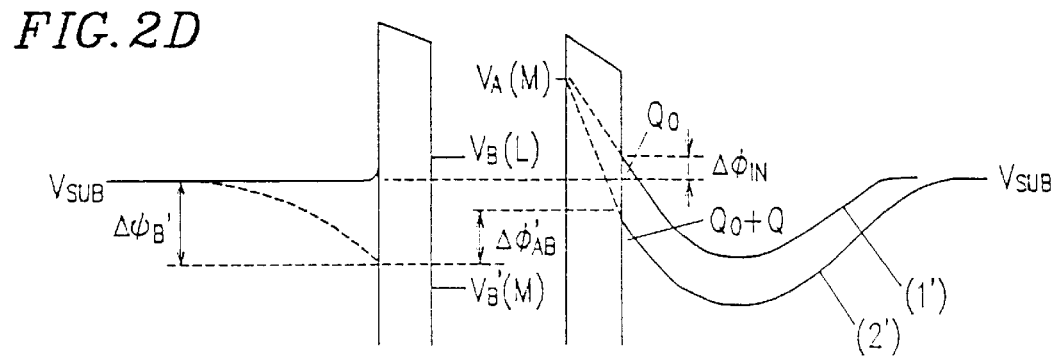

FIG. 2D shows the potential distribution when the injection of the offset charges is injected into the MOSFET. A voltage $V_A(M)$, a little higher than the voltage $V_A(L)$ at the time of the signal accumulation, is applied to the second gate electrode 22, so that the surface potential of the n-layer 24 when no signal charges are accumulated is lower than the potential $V_{SUB}$ of the substrate 21 by the potential difference $\Delta\phi_{IN}$. On the other hand, a voltage $V_B(L)$, equal to or lower than the flat band voltage, is applied to the first gate electrode 23, thereby eliminating the barrier $\Delta\phi_B$. Consequently, the holes continue to flow from the p-substrate 21 into the surface of the n-layer 24, i.e. the offset charges $Q_0$ continue to be injected, until the surface potential of the n-layer 24 has become equal to the potential of the substrate 21.

This state (shown by Line (1') in FIG. 2D) is a dark state. And then the signal accumulation operation is conducted. A moderate voltage, e.g., a voltage $V_B'$ (M) is applied to the first gate electrode 23, and the barrier $\Delta\phi_B'$ is formed under the first gate electrode 23. Under the second gate electrode 22, a signal charge (hole) Q generated by the photoelectric conversion is added to the charge $Q_0$, i.e., the signal charges $Q_0+Q$ are accumulated (shown by Line (2')). This state is a bright state. When the difference $\Delta\phi_{AB}'$ between the surface potential of the n-layer 24 and that under the first electrode 23 is large, for example, $$\Delta\phi_{AB}'>0.5V \quad \text{[Equation 4]}$$

the signal charges remain on the surface, however, once the difference $\Delta\phi_{AB}'$ exceeds the limitation value (e.g. about 0.5 V), the signal charges flow through the potential barrier under the first gate electrode 23 into the substrate 21. Accordingly, the excessive charges can be made to overflow, and the blooming suppression can be conducted.

The signal reading is conducted in the same manner as the above-mentioned signal reading operation, except that the signal must be read out considering the variation of the amount of the signal charges from the charge $Q_0$ to the charge $Q_0+Q$. In the above-mentioned offset charge injection mode, the surface of the n-layer 24 is always covered with the signal charges, so the surface is never depleted, thereby reducing the generation of the dark current. And the amount of the channel potential of the n-layer 24 is supposed to vary in a one-dimensional proportion with the variation of the signal charges, but, in fact, the amount is not always in proportion with the variation of the signal charges by a two-dimensional effect. Such an effect is a main factor of the difference in the amount of the potential variation among respective pixels and the generation of the FPN. Since the two-dimensional effect is remarkable when the signal level is low, this two-dimensional effect can be suppressed and the FPN can be significantly reduced by the injection of the offset charges.

This significant reduction effect of the FPN according to the present invention will be described in more detail.

The FPN generates mainly because of (A) the difference of the offset levels and (B) the difference of the gains. The FPN generated by the cause (A) can be reduced by using an active type photoelectric converting device and obtaining the difference between the output in the bright state and that in the dark state, while the FPN generated by the cause (B) is, usually, extremely difficult to be reduced.

However, the gains (the level of the output signal/the amount of the signal charges) of the amfactive typephotoelectric converting device are inclined to vary greatly at a low signal level, but the difference among the gains decreases when the signal level is moderate or higher, so that the FPN generated by the cause (B) can be reduced. Consequently, if an appropriate amount of offset charges $Q_{offset}$ is injected into the n-layer 24, both types of FPNs generated by the causes (A) and (B) can be reduced by obtaining the difference between the output in the bright state and that in the dark state (at the time of the injection).

Next, the operations shown in FIGS. 2A to 2D will be quantitatively analyzed. As an example, Condition 2 is determined as follows (in this case, the semiconductor made of silicon is employed in the same manner as in Condition 1 of the above-mentioned conventional example).

[Condition 2]

Concentration of the substrate: $N_P=1.0\times10^{15}$ cm$^{-3}$

Concentration of the n-layer: $N_N=3.0\times10^{15}$ cm$^{-3}$

Thickness of the n-layer: $d_N=1.5$ $\mu$m

Thickness of the gate insulating film: d0=80 nm

The density of the signal charges is denoted by $N_{sig}$(cm$^{-2}$).

Under this Condition 2, the distribution of the intrinsic potential $\phi_i$ will be considered. The potential $\phi_i(b)$ in the neutral region of the substrate 21 is set to be 0.0 V, and the surface potential of the n-layer 24 is denoted by $\phi_{i1}(s)$, the bottom of the potential of the n-layer 24 is denoted by $\phi_{i1}(m)$ in the perpendicular direction under the second gate electrode 22. Also, the potential at the surface of the semiconductor under the second gate electrode 22 is denoted by $\phi_{i2}(s)$. The flat band voltage is set to be $-0.85$ V. Following these definitions, the potentials $\phi_{i1}(m)$ and $\phi_{i1}(s)$ and the voltage $V_A$ will be calculated in the respective operational states. [At the time of the signal charge accumulation]

When $V_A(L)=-3.0$ V, $V_B(M)=1.0$ V, and $N_{sig}=0$, $\phi_{i1}(m)=1.72$ V, $\phi_{i1}(s)=-0.93$ V, and $\phi_{i2}(s)=1.34$ V are obtained.

When $N_{sig}=5\times10^{11}$, $\phi_{i1}(m)=2.89$ V and $\phi_{i1}(s)=0.83$ V. Herein, the respective values of $\phi_{i1}(m)$, $\phi_{i1}(s)$ and $\phi_{i2}(s)$ are obtained by the following equations.

Figure 3:
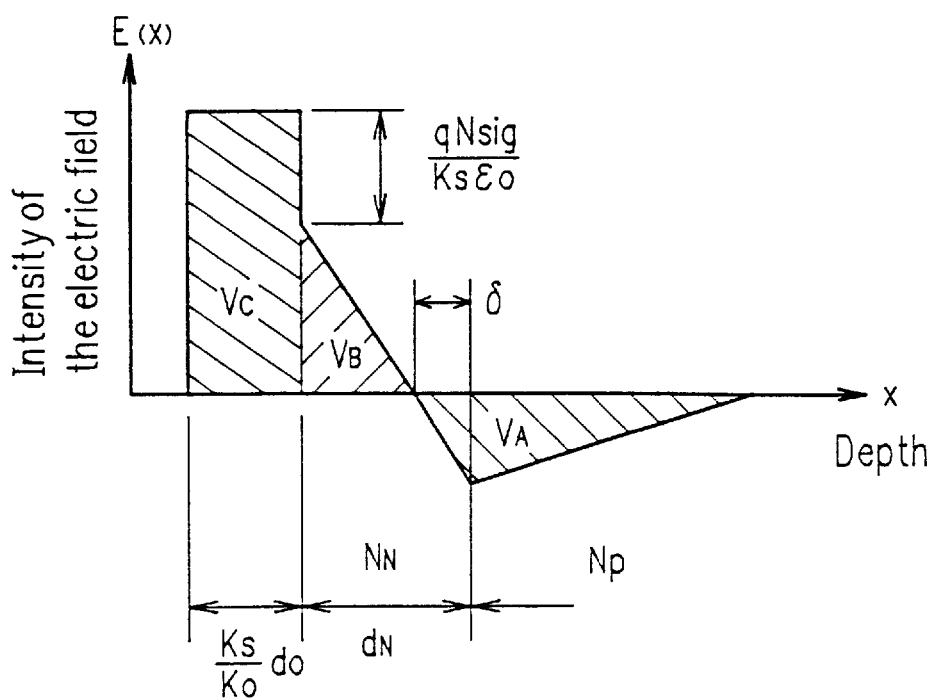
FIG. 3 is a graph showing a distribution of the intensity of the electric field in a direction perpendicular to the semiconductor substrate shown in FIG. 1.

The distribution of the intensity of the electric field E (x) in a direction (x) perpendicular to the p-substrate is shown in FIG. 3. Accordingly, the potentials $\phi_{i1}(m)$ and $\phi_{i1}(s)$ and the voltage $V_A$ are obtained by following Equations 6 to 8 based on Equation 5 defining the potential.

$$\phi_i = \int E(x)dx \quad \text{[Equation 5]}$$

$$\phi_{i1}(m) = \frac{qN_N}{2K_S\epsilon_0}\left(1+\frac{N_N}{N_P}\right)\delta^2 \quad \text{[Equation 6]}$$

-continued $$\phi_{i1}(s) = \phi_{i1}(m) - \frac{qN_N}{2K_S\epsilon_0}(d_N - \delta)^2 \quad \text{[Equation 7]}$$

$$V_A = \phi_{i1}(s) - \frac{qd_0}{K_S\epsilon_0} - \frac{K_S}{K_0}[N_N(d_N - \delta) + N_{sig}] - V_{FB} \quad \text{[Equation 8]}$$

Herein, δ can be obtained by applying the predetermined density of the signal charges $N_{sig}$ and the voltage $V_A$ to Equation 8. And the potentials $\phi_{i1}(m)$ and $\phi_{i1}(s)$ can be obtained by applying δ to the above Equations 6 and 7.

Consequently, the potential differences $\Delta\phi_B$ and $\Delta\phi_{AB}$ shown in FIG. 2A are respectively 1.34 V and 0.51 V when $N_{sig}=5\times10^{11}$, and the signal charges remain accumulated at the surface of the n-layer 24 until the amount thereof reaches approximately $5\times10\text{cm}^{-2}$, and the signal charges overflow once the amount exceeds the above value.

[At the time of the signal reading]

When $V_A(H)=0.0$ V, $V_B(H)=5.0$ V, and $N_{sig}=0$, $\phi_{i1}(m)=3.62$ V, $\phi_{i1}(s)=1.85$ V, and $\phi_{i1}(s)=4.89$ V. Also, when $N_{sig}=5\times10^{11}$, $\phi_{i1}(m)=4.99$ V and $\phi_{i1}(s)=3.63$ V. If the drain voltage $V_D$ is 5.0 V, the drain region 26 has degenerated since the concentration of the region is sufficiently high. Consequently, the Fermi Level has shifted by −0.56 V from the Intrinsic Level and $\phi_{iD}=V_D+0.56$ V. Since $\phi_{iD}=5.56$ V by converting by $\phi_{iD}(m)$, the potential $\phi_{iD}$ is sufficiently larger than the potential $\phi_{i1}(m)$ while $N_{sig}$ is in the range of 0 to $5\times10^{11}$ and the potential can be satisfactorily detected. The difference between the potential difference $\Delta\phi_A(\text{Det})$ and the potential difference $\Delta\phi_A(\text{Sto})$ is expressed by the following Equation 9.

$$\Delta\phi_A(\text{Det})-\Delta\phi_A(\text{Sto})=0.73 \ V \quad \text{[Equation 9]}$$

As a result, the voltage margin between the unread pixel and the read pixel can be sufficiently secured. The signal voltage is detected as a potential difference $\Delta\phi_{i1}(m)$ varied from the potential $\Delta\phi_{i1}(m)$ in accordance with the variation of the signal charges. When $N_{sig}=5\times10^{11}$, $\Delta\phi_{i1}(m)=1.37$ V.

[At the time of the resetting operation]

When $V_A(H)=0.0$ V, $V_B(M)=1.0$ V and $N_{sig}=0$, $\phi_{i1}(m)=3.62$ V, $\phi_{i1}(s)$ 32 1.85 V and $\phi_{i2}(s)=1.34$ V.

When the density of the signal charges $N_{sig}$ is $5\times10^{11}$, $\phi_{i1}(m)=4.99$ V and $\phi_{i1}(s)=3.63$ V. That is, when $N_{sig}$ is in the range of 0 to $5\times10^{11}$, $$\phi_{i1}(s)>\phi_{i2}(s) \quad \text{[Equation 10]}$$

Consequently, all the signal charges flow from the surface of the semiconductor (n-layer 24) under the first gate electrode 23 via the semiconductor under the second gate electrode 22 into the substrate 21.

[At the time of the injection of the offset charges]

When $V_A(M)=-2.5$ V, $V_B(L)=-1.0$ V and $N_{sig}(\text{ofs})=1.33\times10^{11}$, $\phi_{i1}(m)=2.32$ V, $\phi_{i1}(s)=0.00$ V and $\phi_{i2}(s)=0.00$ V.

That is, the signal charges (holes) flow from the substrate 21 via the semiconductor under the first gate electrode 23 into the surface of the n-semiconductor layer 24 under the second gate electrode 22 and continue to be accumulated there until the density of the signal charges $N_{sig}$ (ofs) reaches $1.33\times10^{11}$. Accordingly, if the operational mode of the active type photoelectric converting device of the present invention is converted into the above-mentioned mode [at the time of the signal charge accumulation] after this operation is over, the signal charges, the amount of which has been increased by the density of the signal charges $N_{sig}(\text{ofs})$, are accumulated on the surface of the n-semiconductor layer 24 under the second gate electrode 22. The signal reading is conducted as follows: the operational mode of the active type photoelectric converting device is converted into the mode [at the time of the signal reading] immediately after the injection of the offset charges and after the accumulation of the optical signals; then the difference between the signal level after the injection of the offset charges and that after the accumulation operation of the optical signals is calculated by a known method: e.g., the output level at the time of the signal reading is clumped and reset, then the level is sample-held at the level immediately after the injection of the signal charges.

FIGS. 4A and 4B show the variations of the potentials in the respective operational modes: FIG. 4A shows the variation of the surface potential $\phi_i(s)$ in accordance with that of the amount of the signal charges; and FIG. 4B shows the variation of the buried channel potential $\phi_i(m)$ in accordance with that of the amount of the signal charges. In this case, the maximum density of the signal charges is $5\times10^{11}$ cm$^{-2}$. However, in the case where the size of the pixel is as small as approximately 5 μm×5 μm (i.e. 25 μm$^2$) and the area of the second gate electrode 22 is approximately 10 μm$^2$, the number of the holes is as large as 50,000, which is a sufficient signal level per one pixel.

As has been analyzed quantitatively above, according to the present invention, a high voltage is not required at the time of the resetting operation with a sufficient signal level maintained. In this embodiment, all the operations can be conducted if a source in a voltage of −3 to 5 V is used. In addition, a driving voltage can be easily changed if the conditions such as the concentration of the impurity and the thickness of the respective silicon layers are changed.

Figure 5A:
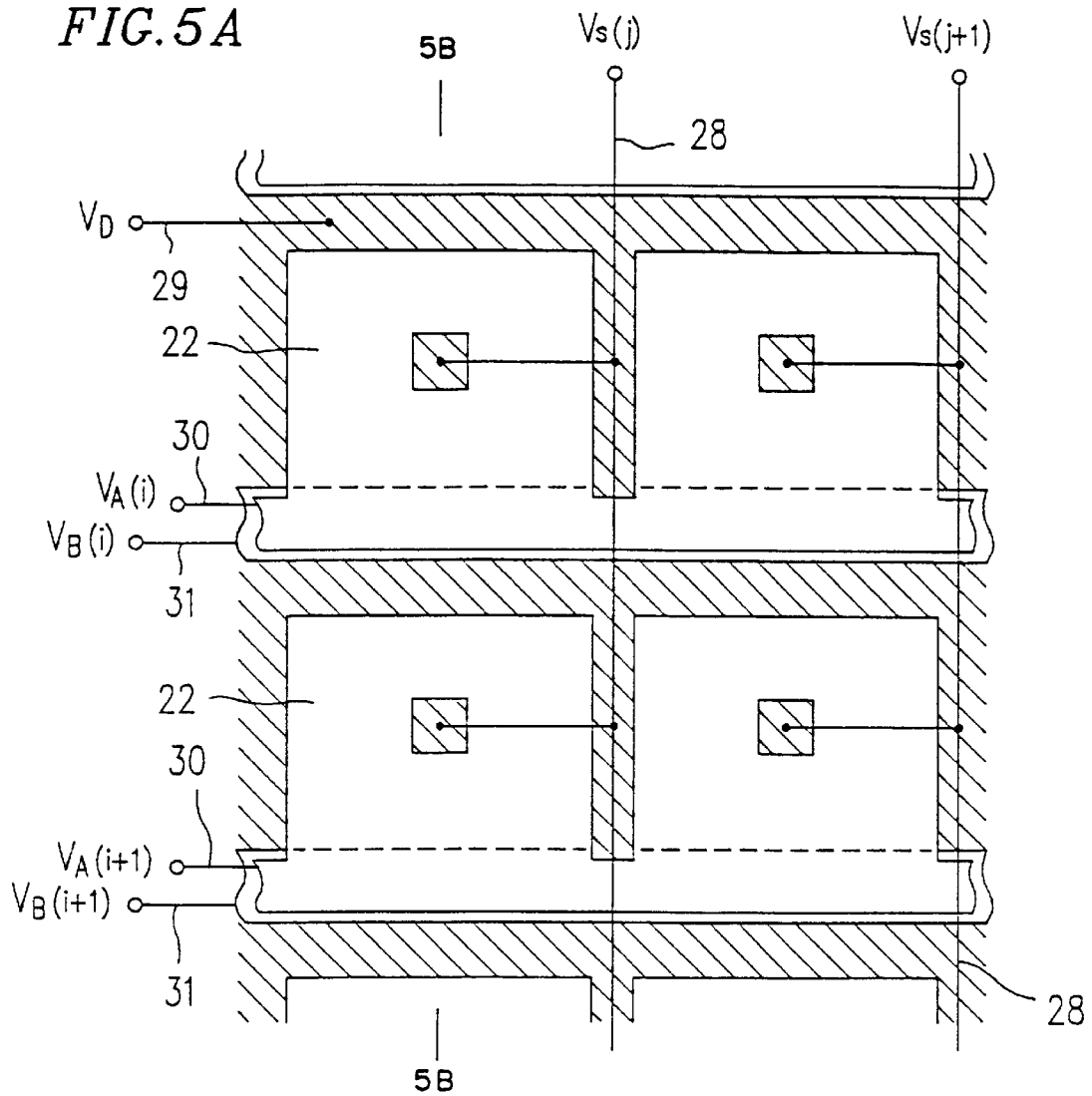
FIG. 5A is a plan view showing an example of the configuration of a two-dimensional image sensor using the active type solid-state imaging device of FIG. 1.
Figure 5B:
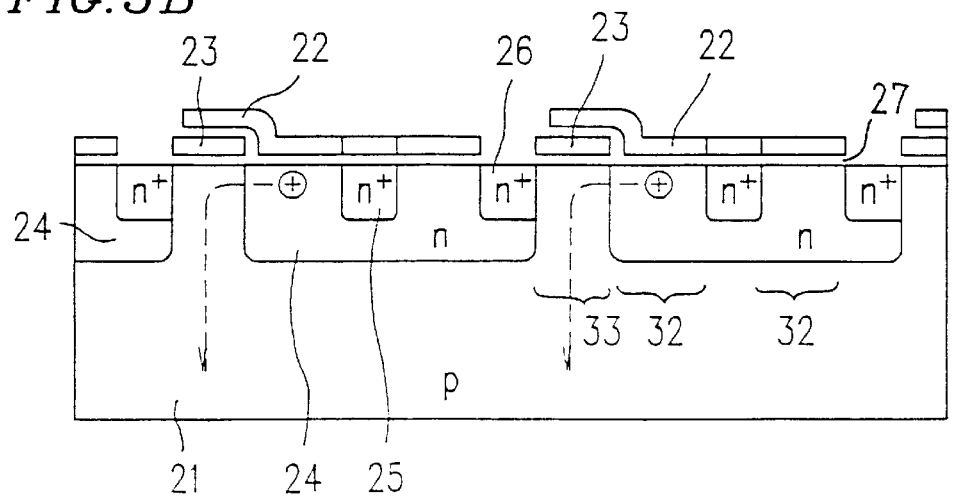
FIG. 5B is a cross-sectional view taken along the line 5B—5B in FIG. 5A.

FIGS. 5A and 5B show an example of the configuration of a two-dimensional image sensor serving as an active type solid-state imaging device (hereinafter, simply referred to as a solid-state imaging device) using the pixel unit of the photoelectric converting device shown in FIG. 1. Specifically, FIG. 5A is a plan view of the solid-state imaging device and FIG. 5B is a cross-sectional view taken along the line C—C in FIG. 5A. Second gate regions 32 including the second gate electrodes 22 are connected in common to clock lines 30 denoted by $V_A(i)$, $V_A(i+1)$, etc. in a horizontal direction of FIG. 5A, and first gate regions 33 including the first gate electrodes 23 are connected in common to clock lines 31 denoted by $V_B(i)$, $V_B(i+1)$, etc. also in the horizontal direction. The first gate electrodes 23 are formed so as to be partially covered by the second gate electrodes 22.

The source regions 25 are formed in the middle of the second gate regions 32 of the n-layer 24 of the respective pixel units and connected in common to signal lines 28 denoted by $V_S(j)$, $V_S(j+1)$, etc. in a perpendicular direction of FIG. 5A. The drain regions 26 are formed around the respective pixels shown in the hatched portions of FIG. 5A and the voltage $V_D$ is applied through the drain terminal 29 and the hatched portions. As is shown in FIG. 5B, the respective pixels are formed on the p-substrate 21, and the n-layer 24 is formed except for the portions under the first gate regions 33.

As is apparent from the above-mentioned configuration, the pixel isolation regions are formed by the drain regions 26 and the first gate regions 33 including the regions under the first gate electrodes 23. The variation of the potential of the second gate regions 32 surrounding the source regions 25 in the respective pixels is obtained as the variation of the source potential. Under such a simple configuration, it is possible to form easily a two-dimensional image sensor serving as an active type solid-state imaging device by using the active type photoelectric converting device shown in FIG. 1.

Figure 6A:
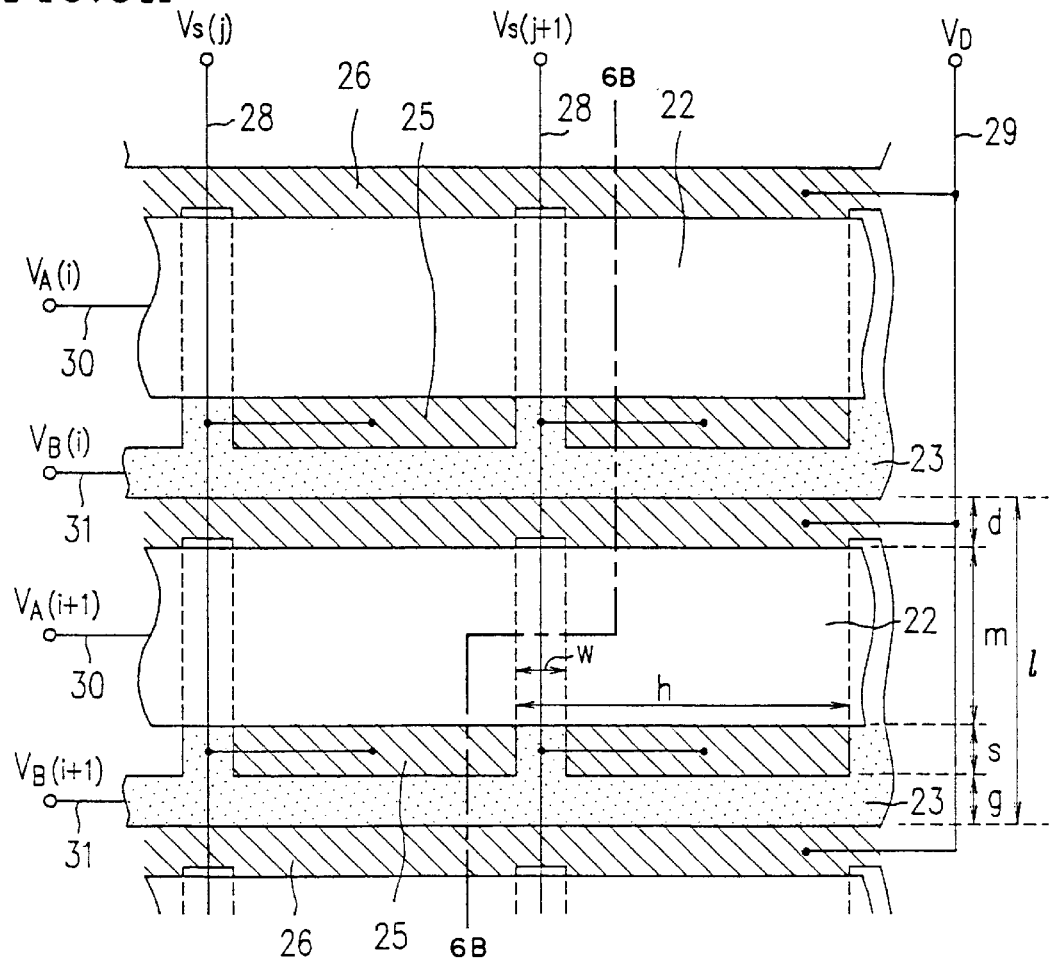
FIG. 6A is a plan view showing another example of the configuration of the two-dimensional image sensor using the active type solid-state imaging device of FIG. 1
Figure 6B:
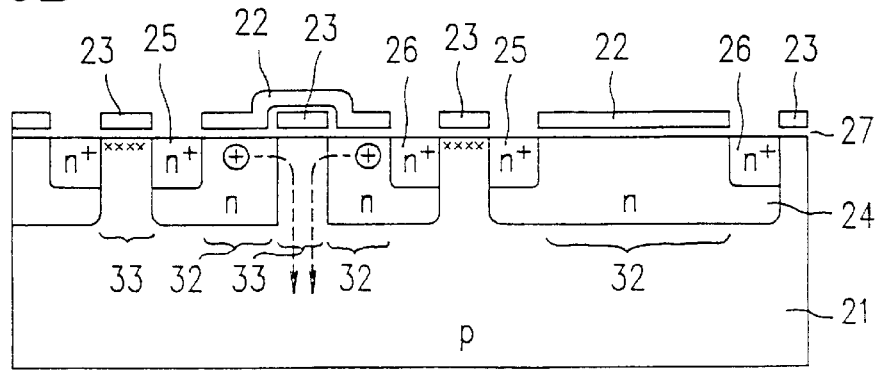
FIG. 6B is a cross-sectional view taken along the line 6B—6B in FIG. 6A.

FIG. 6A and 6B show another example of the configuration of the two-dimensional image sensor using the pixel unit shown in FIG. 1. Specifically, FIG. 6A is a plan view of the solid-state imaging device and FIG. 6B is a cross-sectional view taken along the line D—D in FIG. 6A. The active type solid-state imaging device in this example is similar to that in the previous example, therefore the same or similar components thereof are denoted by the same reference numerals, and the explanations thereof will be omitted. In the solid-state imaging device of this example, the second gate regions 32 are connected in common to the clock lines 30 denoted by $V_A(i)$, $V_A(i+1)$, etc. in a horizontal direction and the first gate regions 33 are connected in common to the clock lines 31 denoted by $V_B(i)$, $V_B(i+1)$, etc. also in the horizontal direction. The first gate electrodes 23 are formed under the second gate electrodes 22 and horizontally isolate the pixels.

The drain regions 26, shown by the hatched portions between the horizontally adjacent rows of the pixels of FIG. 6A, are formed so as to vertically isolate the pixels and a voltage $V_D$ is applied via the surrounding regions to the drain regions 26. The source regions 25 are formed in the respective pixels so as to oppose the drain regions 26 interposing the second gate regions 32 therebetween, i.e., under the same configuration as that of an ordinary MOS-FET. And the source regions 25 are connected in common to the signal lines 28 denoted by $V_S(j)$, $V_S(j+1)$, etc. in a perpendicular direction. Through the signal lines 28, the variation of the potentials of the second gate regions 32, interposed by the source region 25 and the drain region 26 in one pixel unit, is detected as the variation of the source potential. As is shown in FIG. 6B, the respective pixels are formed on the p-substrate 21 and the n-layer 24 is formed thereon except for the regions under the first gate electrodes 33. In the vicinity of the surface of the first gate regions 33 (as is shown by the dotted portions of FIG. 6A), excluding those covered by the second gate electrodes 22, i.e., in the vicinity of the surface of the p-substrate 21 (as is shown by crosses FIG. 6B) is implanted p-impurity. The reason thereof will be described below.

Figure 7:
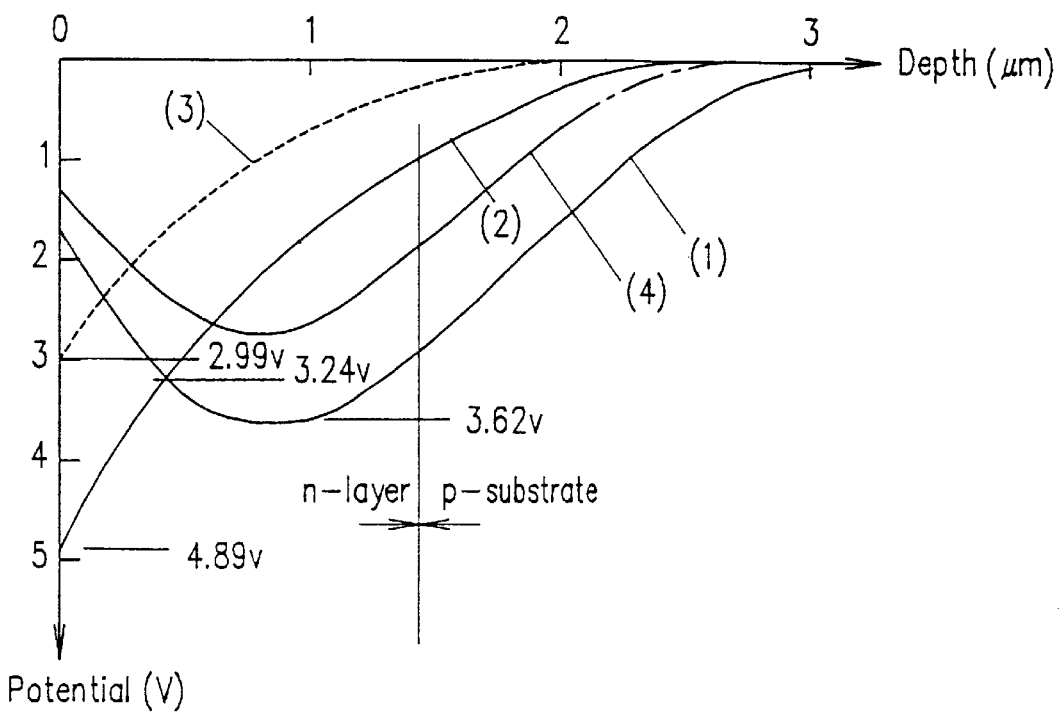
FIG. 7 is a graph showing potential distributions in a direction perpendicular to the semiconductor substrate shown in FIG. 6B.

At the time of the signal reading shown in FIG. 2B, the surface potentials of the first gate regions 33 are higher than the maximum value $\phi_{i1}(m)$ of the potential of the n-layer 24 under the second gate regions 32 in most cases. FIG. 7 is a graph showing the distribution of the potentials in the perpendicular direction at the time of the signal reading under the above-mentioned Condition 2. In this figure, the distribution of the potential under the second gate electrodes 22 is indicated by Line (1), and the distribution of the potential under the first gate electrodes 23 is indicated by Line (2).

As is shown in FIG. 7, the potential $\phi_{i2}(s)$ is 4.89 V and the potential $\phi_{i1}(m)$ is 3.62 V. The source potential is equal to the potential $\phi_{i1}(m)$ and the drain potential $\phi_{iD}$ is 5.56 V. If the source region 25 is in contact with the drain region 26 via the channel shown by Line (2), the current flows between the source region 25 and the drain region 26 via the channel. As a result, the signal to be read out does not depend any longer on the channel potential of the n-layer 24 under the second gate electrodes 22. Accordingly, if the p-impurity is implanted into the second gate regions 32 between the source region 25 and the drain region 26, the surface potential of the region under the first gate electrode 23 can be lowered to the following value as is shown by Line (3) of FIG. 7:

$$\phi_{i2}'(s)=2.99\ V<\phi_{i1}(m) \quad \text{[Equation 11]}$$

In the potential shown by Line (3) of FIG. 7, the amount of the implanted impurity is $5\times10^{11}$ cm$^{-2}$. Consequently, the current no longer flows between the source region 25 and the drain region 26 via the first gate region 33.

As is shown in FIG. 7, in horizontally isolating the pixels in the first gate regions 33, a barrier having a voltage of 0.38 V (i.e. 3.62–3.24) exists against the electrons and, in fact, in the n-layer 24 around the first gate regions 33 the concentration is lowered slightly by the lateral diffusion at the time of the fabrication, so the actual distribution of the potential becomes that shown by Line (4) of FIG. 7. Consequently, the barrier against the potential in the middle of the n-layer 24 is strengthened and the undesirable flow of the charges (or the electrons) can be eliminated.

As has been described above, if the active type solid-state imaging device according to this example is fabricated under the above-mentioned configuration of FIGS. 6A and 6B, different from that of FIGS. 5A and 5B, a two-dimensional image sensor can be easily fabricated by using the active type photoelectric converting device shown in FIG. 1.

The two-dimensional image sensor according to this example brings the following peculiar effects in addition to those described with respect to the two-dimensional image sensor of FIGS. 5A and 5B.

(1) Effect on the channel length of the gate:

In the active type solid-state imaging device under the configuration of FIGS. 5A and 5B, the current flows radially between the source region 25 and the drain region 26 and the gate lengths are different from each other depending on the direction of the current flow. On the other hand, in the active type solid-state imaging device of FIGS. 6A and 6B, the current flows in one direction between the source region 25 and the drain region 26, the channel lengths are fixed, and the channel configuration is the same as that of an ordinary MOS transistor. Accordingly, the relationship between the amount of the signal charges and the variation of the potential in the active type solid-state imaging device shown in FIGS. 6A and 6B is simpler than that of the active type solid-state imaging device of FIGS. 5A and 5B having two-dimensional effects in the longitudinal direction of the channel. Namely, the active type solid-state imaging device of FIGS. 6A and 6B serving as a two-dimensional image sensor has a simplified one-dimensional relationship between the signal charges and the potential and a more satisfactory characteristic of the output of the photoelectric conversion.

(2) Effect on the effective photoelectric converting region:

In the imaging device under the configuration of FIGS. 5A and 5B, both the surrounding regions and the middle regions of the respective pixels are ineffective photoelectric converting regions. On the other hand, in the imaging device of FIGS. 6A and 6B, only the surrounding regions are ineffective photoelectric converting regions. Consequently, the imaging device of FIGS. 6A and 6B brings a peculiar effect where the effective numerical aperture can be easily improved by using a microlens, and the like.

Figure 8:
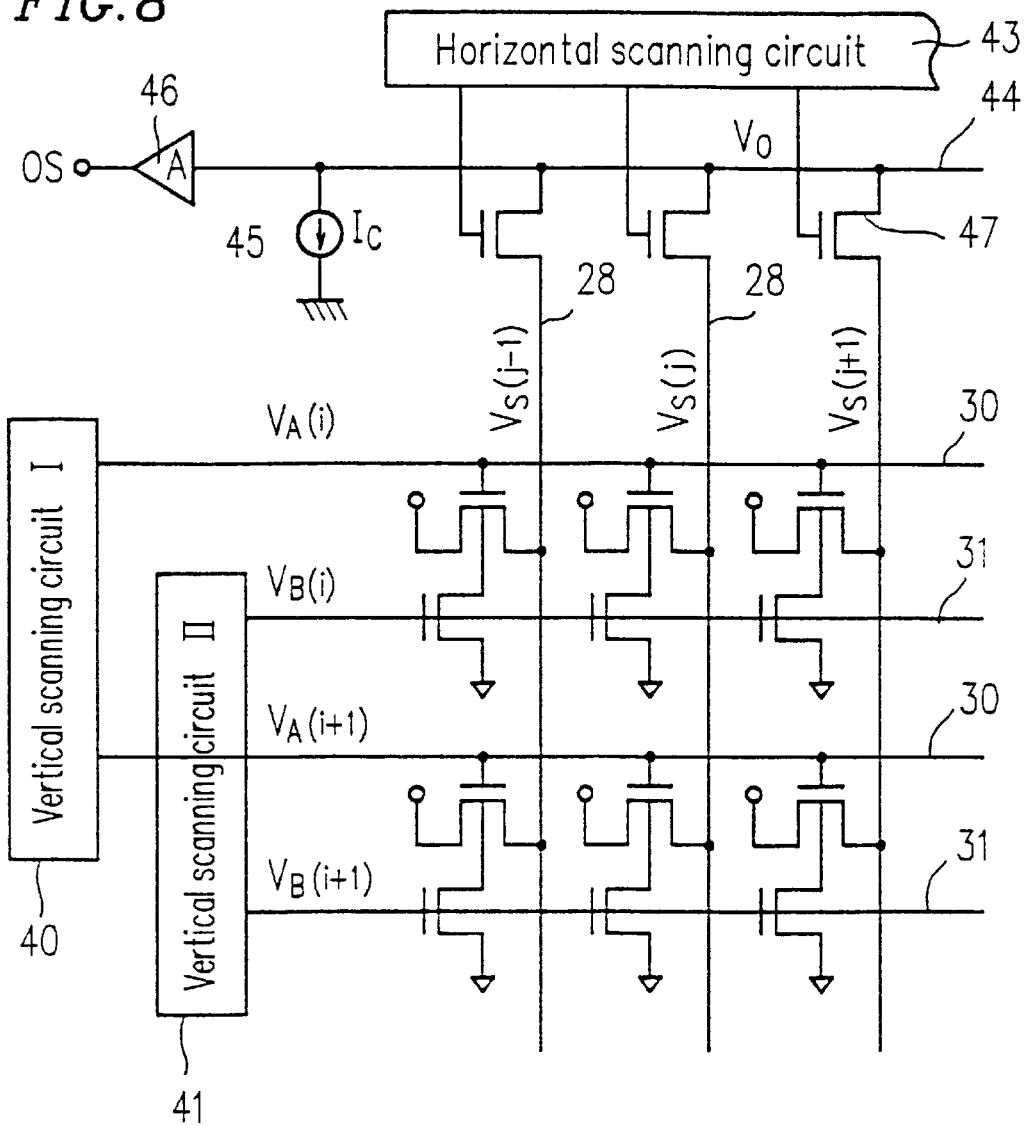
FIG. 8 is a circuit diagram showing an example of the configuration of the two-dimensional image sensor using the active type solid-state imaging device of FIG. 1.

FIG. 8 shows an example of the configuration of a circuit to drive either of the two-dimensional image sensors shown in FIGS. 5A, 5B, 6A, and 6B. Clock lines 30 ($V_A(i)$, $V_A(i+1)$, etc.) are connected to the second gate regions 32 and a first vertically scanning circuit 40. Clock lines 31 ($V_B(i)$, $V_B(i+1)$, etc.) are connected to the first gate regions 33 and a second vertically scanning circuit 41. And vertical signal lines ($V_S(j+1)$, etc.) 28 are also connected via the MOSFET 47 to common signal lines ($V_O$) 44. The constant current charges ($I_C$) 45 are connected to the common signal lines 44, and an signal OS is output via the buffer amplifier 46 to the common signal lines 44. The scanning signals from a horizontally scanning circuit 43 are supplied to the gate of the respective MOSFETs 47.

Figure 9:
FIG. 9 is timing charts showing examples of the driving timings of the two-dimensional image sensor using the active type solid-state imaging device of FIG. 1.

FIG. 9 is timing charts showing examples of the driving timings of the two-dimensional image sensor driving circuit shown in FIG. 8. In this figure, $V_A(k)$ denotes the (k)th horizontal clock line 30 of the second gate electrode ($V_A$) and $V_B(k)$ denotes the (k)th horizontal clock line 31 of the first gate electrode ($V_B$), and so on. During the (i–1)th horizontal scanning period, the (i–1)th horizontal clock line is set at the reading operation mode, and the pixel signals on the horizontal (i–1)th line can be obtained in the output signal OS. During the following horizontal blanking period, the resetting operation starts, and the pixel signals on the horizontal (i–1) line are reset. In the same way, the remaining pixel signals on the following horizontal lines are sequentially read out and reset.

Figure 10:
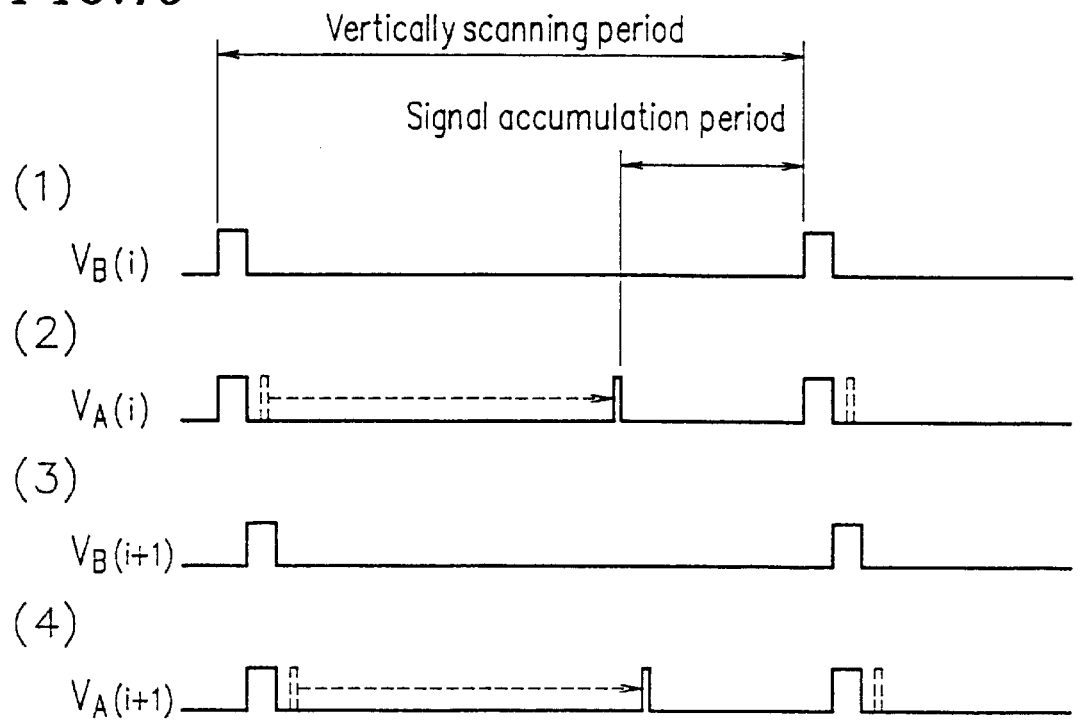
FIG. 10 is timing charts showing examples of the driving timings of the two-dimensional image sensor using the active type solid-state imaging device of FIG. 1 when a shutter operation is conducted.

FIG. 10 illustrates the timings for a shutter operation method in which the effective signal accumulation period is shortened by bringing the timing of the resetting operation close to that of the following reading operation, following the examples of the timings of the two-dimensional image sensor driving circuit shown in FIG. 9. As shown in this figure, during the vertical scanning period through which the signals are accumulated in an ordinary case, the resetting pulse is delayed from the ordinary position shown by the broken lines to the position shown by the solid lines for the shutter operation, thereby shortening the signal accumulation period.

FIG. 11 illustrates the timings for operation of the injection of the offset charges following the examples of the timings of the two-dimensional image sensor driving circuit shown in FIG. 9, i.e. in FIG. 11, the resetting operations of FIG. 9 is replaced by the injection operations. In this case, in the same way as in FIG. 2D, the voltage $V_A(i)$ is set to be a voltage $V_A(M)$ a little higher than that at the time of the signal accumulation operation, and the voltage $V_B(i)$ is set to be a voltage $V_B(L)$ a little lower than that at the time of the signal accumulation operation. After the injection operation, the offset charges are read out as the signal charge reading operation and then the above-mentioned ordinary signal charge accumulation operation is conducted. The output signal can be read out by a known subtraction method in which the value obtained at the time of the reading operation before the injection operation (the signal charges+the offset charges) is subtracted from the value obtained at the time of the offset charge reading operation.

Figure 12A:
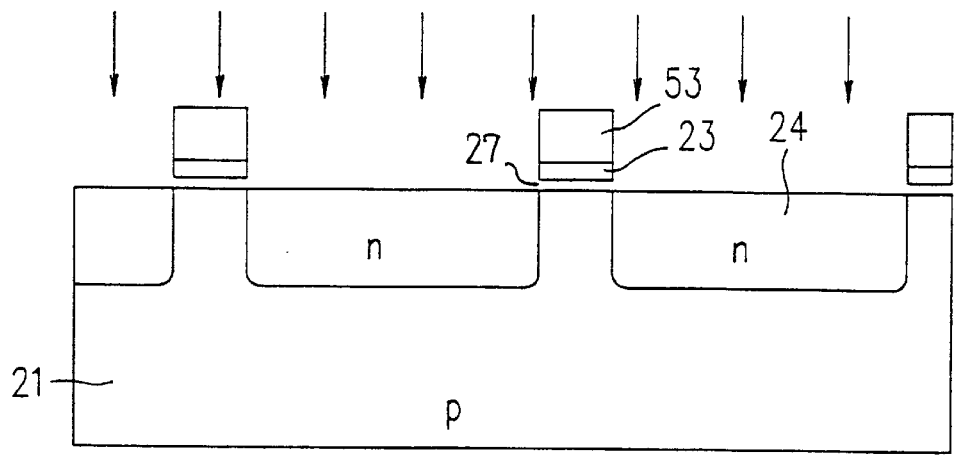
FIGS. 12A to 12C are cross-sectional views showing an example of a method for producing the active type solid-state imaging device of FIG. 1.
Figure 12B:
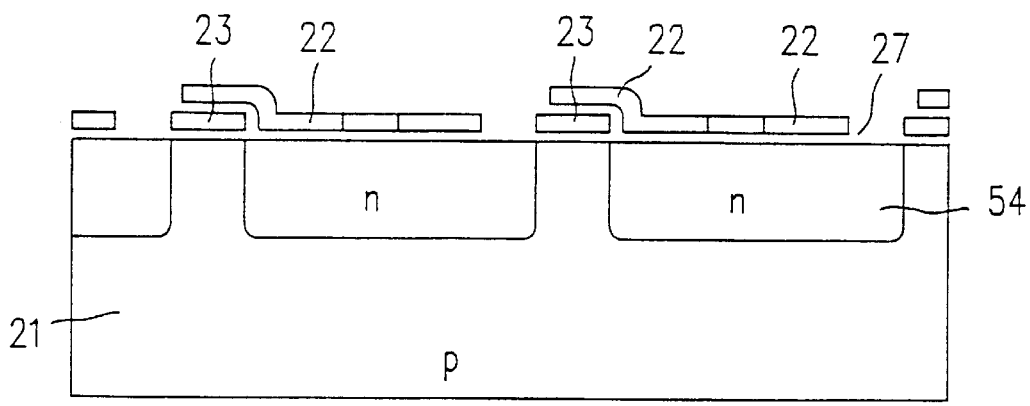
Figure 12C:
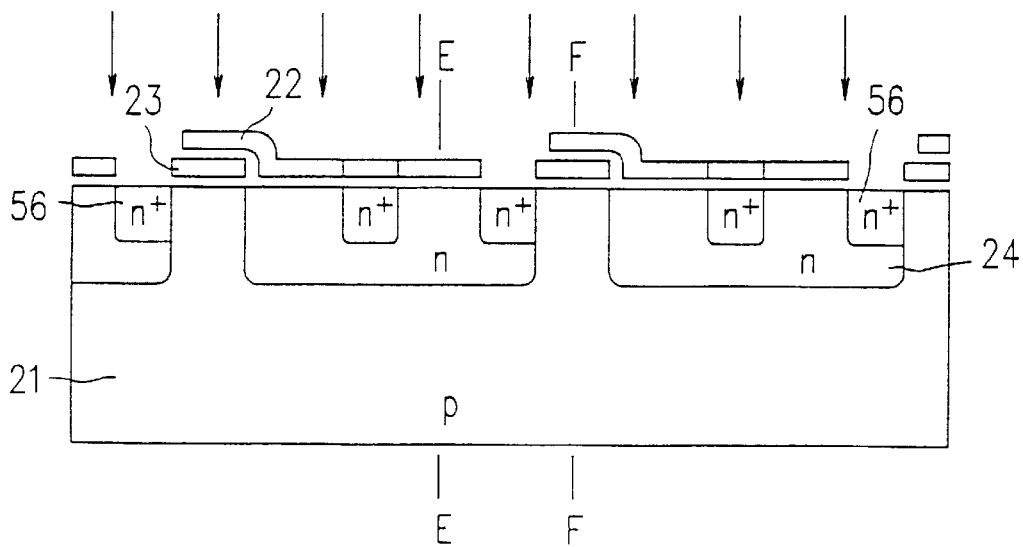

FIGS. 12A to 12C show an example of a method for producing the pixel unit of FIG. 1 according to the present invention. The sizes, concentrations, and the like of the respective portions are determined following the above-mentioned Condition 2. As is shown in FIG. 12A, a gate insulating film 27 is first formed on the p-substrate 21 and then the first gate electrodes 23 are formed thereon by using a photoresist 53 as a mask. Next, the n-layer 24 is formed by the ion implantation of the n-impurity and using the first gate electrodes 23 and the photoresist 53 as a mask. Approximately 1.0 MeV of implantation energy is required in order that the junction depth of the n-layer 24 is about $1.5 \times 10^{-4}$ cm of Condition 1 and the n-layer 24 can be formed in a self-alignment manner by using the combined layer of the electrodes 23 and the photoresist 53 as a mask.

Figure 13:
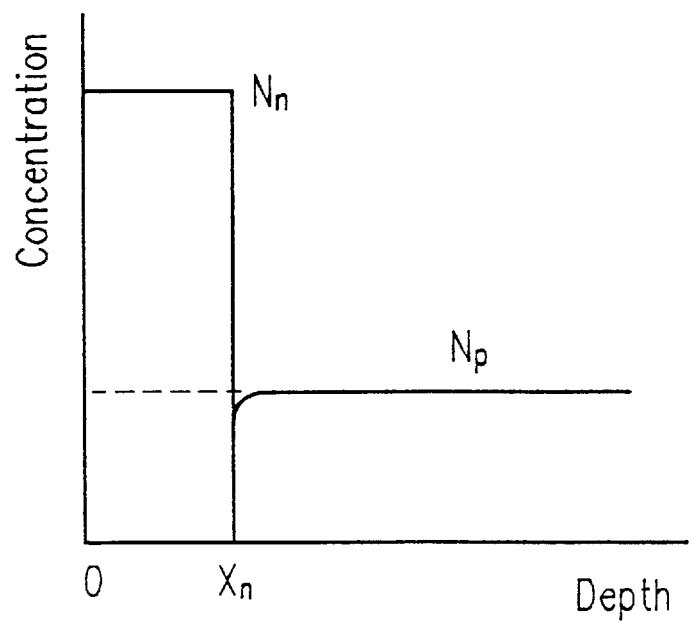
FIG. 13 is a graph showing a distribution of the concentration of the impurity in the semiconductor layer of the imaging device shown in FIGS. 12A and 12C.

Then, as is shown in FIG. 12B, the photoresist 53 is removed, an insulating layer 27 is formed on the electrodes 23 and the n-layer 24, and the second gate electrodes 22 are formed. Furthermore, as is shown in FIG. 12C, an n-impurity in a high concentration is implanted or diffused by using the electrodes 22 and 23 as a mask, thereby forming $n^+$ regions 56 for constituting the source regions 25 and the drain regions 26. FIG. 13 shows the distributions of the concentration of the impurity on the cross-sectional planes along the line E—E (indicated by the solid line) and the line F—F (indicated by the broken line) in FIG. 12C.

According to such a production method, an amfactive typephotoelectric converting device under the above-mentioned configuration can be formed.

An MOSFET is used as a transistor for the photoelectric converting region according to the above-mentioned examples. Hereinafter, examples in which a junction gate FET is used for the region will be described.

Figure 14:
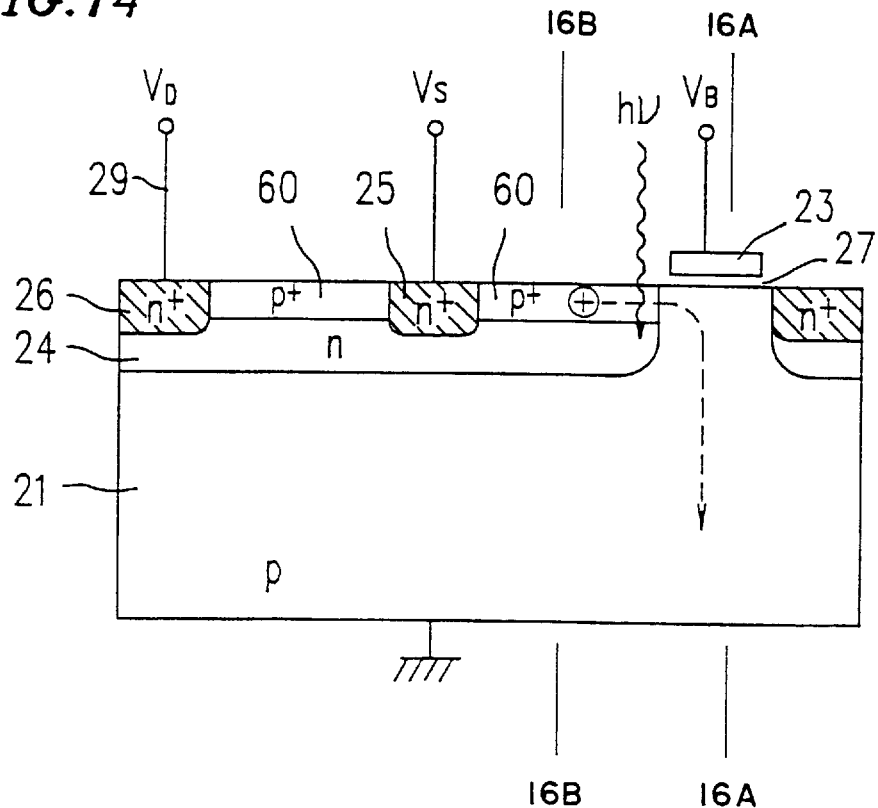
FIG. 14 is a cross-sectional view showing an example of a pixel unit of the active type solid-state imaging device according to the present invention which employs a junction gate FET for a photoelectric converting element.
Figure 15:
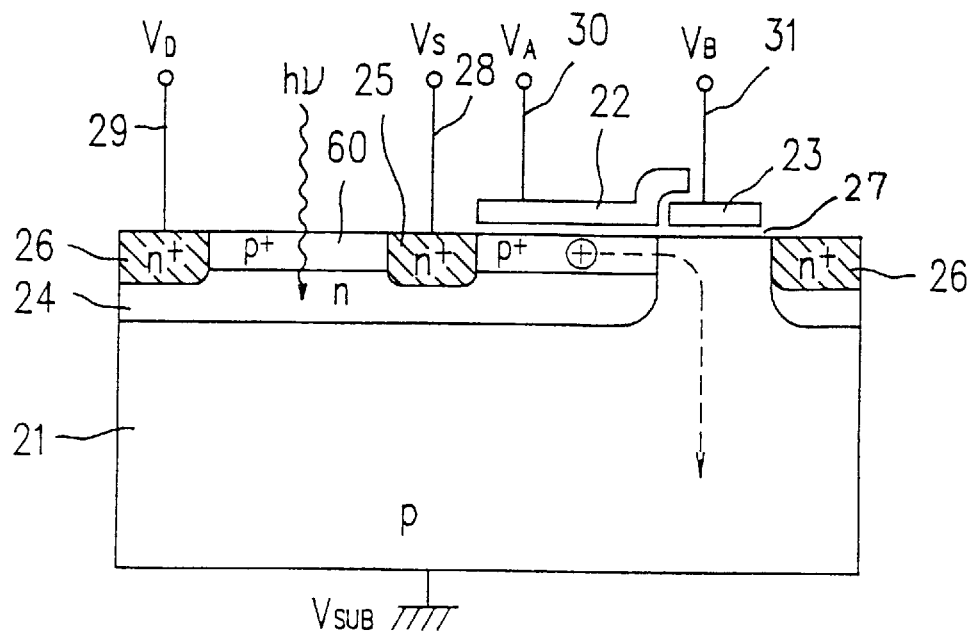
FIG. 15 is a cross-sectional view showing another example of the pixel unit of the active type solid-state imaging device according to the present invention when the photoelectric converting region is a junction gate FET.

FIGS. 14 and 15 are cross-sectional views showing examples of the pixel units of the active type photoelectric converting devices using a junction gate FET. FIG. 14 shows an example in which no gate electrodes are provided in the photoelectric converting region of the active type photoelectric converting device and FIG. 15 shows an example in which gate electrodes are provided in parts of the photoelectric converting region. In the device of FIG. 15, the driving method and the circuit configuration are the same as those of the device of FIG. 1 and $p^+$ junction gates 60 into which p-impurity is implanted so as to be in a high concentration are formed in the regions corresponding to the regions of the n-layer 24 under the second gate electrodes 22 of the active type photoelectric converting device of FIG. 1.

Accordingly, only the device of FIG. 14 will be adopted for explanation. In the active type photoelectric converting device of FIG. 14, the n-layer 24 and the second gate regions 32 including the $p^+$ junction gates 60 superposed on the n-layer 24 are formed on the p-semiconductor substrate 21. Moreover, the first gate electrodes 23 are formed on the substrate 21 via the insulating layer 27, thereby forming the first gate regions 33. And the $n^+$ diffusion layer serving as the source regions 25 and the drain regions 26 for the FET is formed interposing the junction gates 60 therebetween.

The junction gates 60 are in an electrically floating state because of the following reasons. The light hυ incident into the junction gate 60 regions generates an electron-hole pair by the photoelectric conversion. The electrons flow into the drain regions 26 and the holes are enclosed by the barrier in the middle of the n-layer 24 and the barrier under the first gate electrodes 23 and accumulated in the junction gates 60 to form the signal charges. If the junction gates 60 are in a floating state, the potential of the junction gates 60 varies in accordance with the amount of the signal charges and, as a result, the potential of the n-layer 24 also varies. This variation of the potential of the n-layer 24 is read out as the variation of the source potential or that of the current, thereby obtaining the output signal.

Under the configuration of FIG. 14, the junction gates 60 must be in a floating state all through the signal charge accumulation period and the signal reading period. At the time of the resetting operation, the junction gate 60 can be electrically connected to the substrate 21 via the channel under the first gate electrode 23, and the potential of the junction gates 60 are reset to the potential of the substrate 21. In other words, at the time of the resetting operation, the signal charges, flowing along the route shown by the broken line in this figure, are discharged into the p-substrate 21, because the potential barriers under the first gate electrodes 23 are lowered. By the way, under the present configuration, since no electrodes are provided in the photoelectric converting regions, all the incident light enters the semiconductor region of the junction gates 60, and a high sensitivity is exhibited in the short wavelength regions in particular.

Figure 16A:
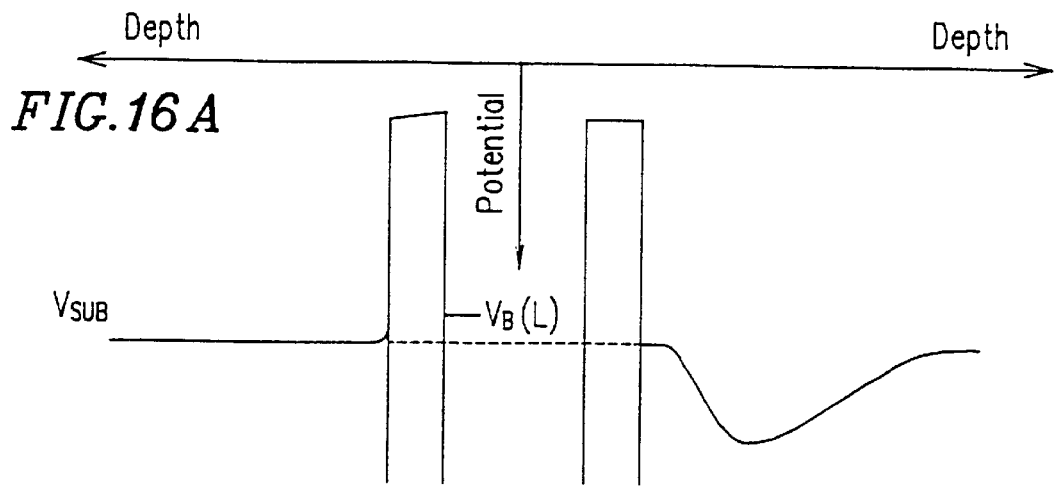
FIGS. 16A and 16B show potential distributions in directions along the line 16A—16A and the line 16B—16B in FIG. 14.
Figure 16B:
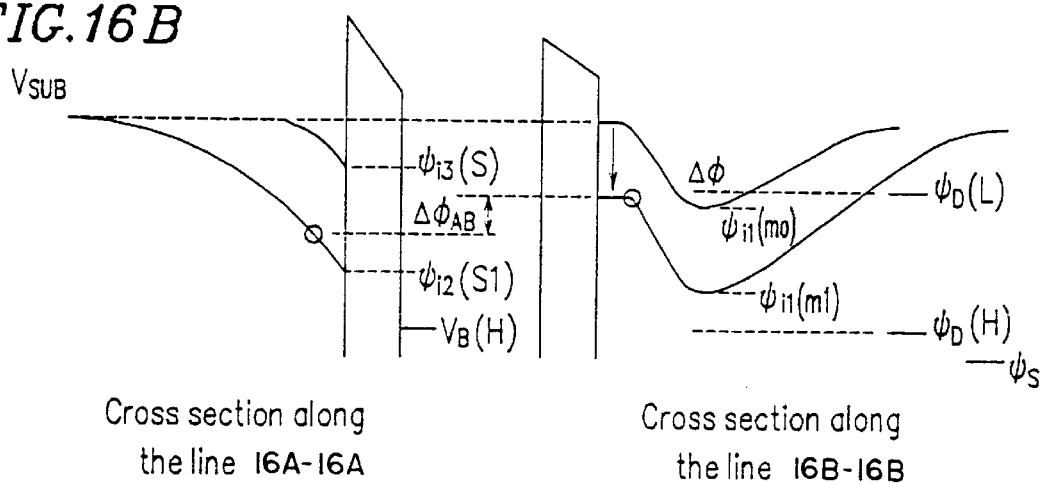

Referring to FIGS. 16A and 16B, the operation of the active type photoelectric converting device of FIG. 14 will be explained in more detail. In both of these figures, the distribution of the potential of the cross-sectional plane along the line G—G in FIG. 14, i.e., in a perpendicular direction of the junction gate 60, is shown on the right sides thereof and the distribution of the potential of the cross-sectional plane along the line H—H in FIG. 14, i.e., in a perpendicular direction of the region under the first gate electrodes 23, is shown on the left sides thereof. FIG. 16A shows the distribution of the potential at the time of the resetting operation. A low voltage $V_B(L)$, lower than the flat band voltage, is applied to the first gate electrodes 23. Then, the depletion layer under the first gate electrodes 23 disappears and the potential becomes uniform. As a result, the junction gates 60 are coupled with the p-substrate 21 and the potential of the junction gates 60 becomes equal to the potential 0 V of the substrate 21. And the charges (holes) which have been accumulated in the junction gates 60 are discharged into the substrate 21, thereby accomplishing the resetting operation. Therefore, it is possible to proceed onto the accumulation operation of the following image information after clearing all the image information. In addition, if the resetting operation is conducted at the middle stage of the optical integration period, all the image information up to that point is cleared. Thus, so-called shutter operation can be conducted by accumulating only the information since the clearance of the image information.

FIG. 16B shows the distribution of the potential at the time of the signal accumulation. A high voltage $V_B(H)$ is applied to the first gate electrodes 23. On the other hand, the holes generated by the photoelectric conversion are accumulated in the junction gates 60, and the potential of the junction gates 60 is elevated. Until the potential difference $\Delta\phi_{AB}$ between the potential of the junction gates 60 and that of the potential barrier under the first gate electrodes 23 reaches 0.5 V, the holes will be prevented from flowing from the junction gates 60 into the p-substrate 21. When the intensity of the incident light becomes large, and the potential difference $\Delta\phi_{AB}$ becomes equal to and less than 0.5 V, the excessive holes flow through the barrier into the substrate 21 and the blooming is suppressed. As the potential of the junction gates 60 becomes higher, the potential of the n-layer 24 becomes from $\phi_{i1}(m_0)$ to $\phi_{i1}(m_1)$. If both the source potential $\phi_S$ and the drain potential $\phi_D(H)$ are of higher values over the potential range of $\phi_{i1}(m_0)$ to $\phi_{i1}(m_1)$, the current does not flow between the source region 25 and the drain region 26. FIG. 16B shows the distribution of the potential at the time of the signal charge reading operation. In this case, the source potential is kept at a high value of $V_S$, while the drain potential is set to be at a lower value of $\phi_D(L)$, over the potential range of $\phi_{i1}(m_0)$ to $\phi_{i1}(m_1)$. As a result, the current flows in the opposite direction to the ordinary one, i.e., from the source region 25 into the drain region 26. Since this current depends on the potential of the n-layer 24, this current can be used as a sensor signal.

Figure 17A:
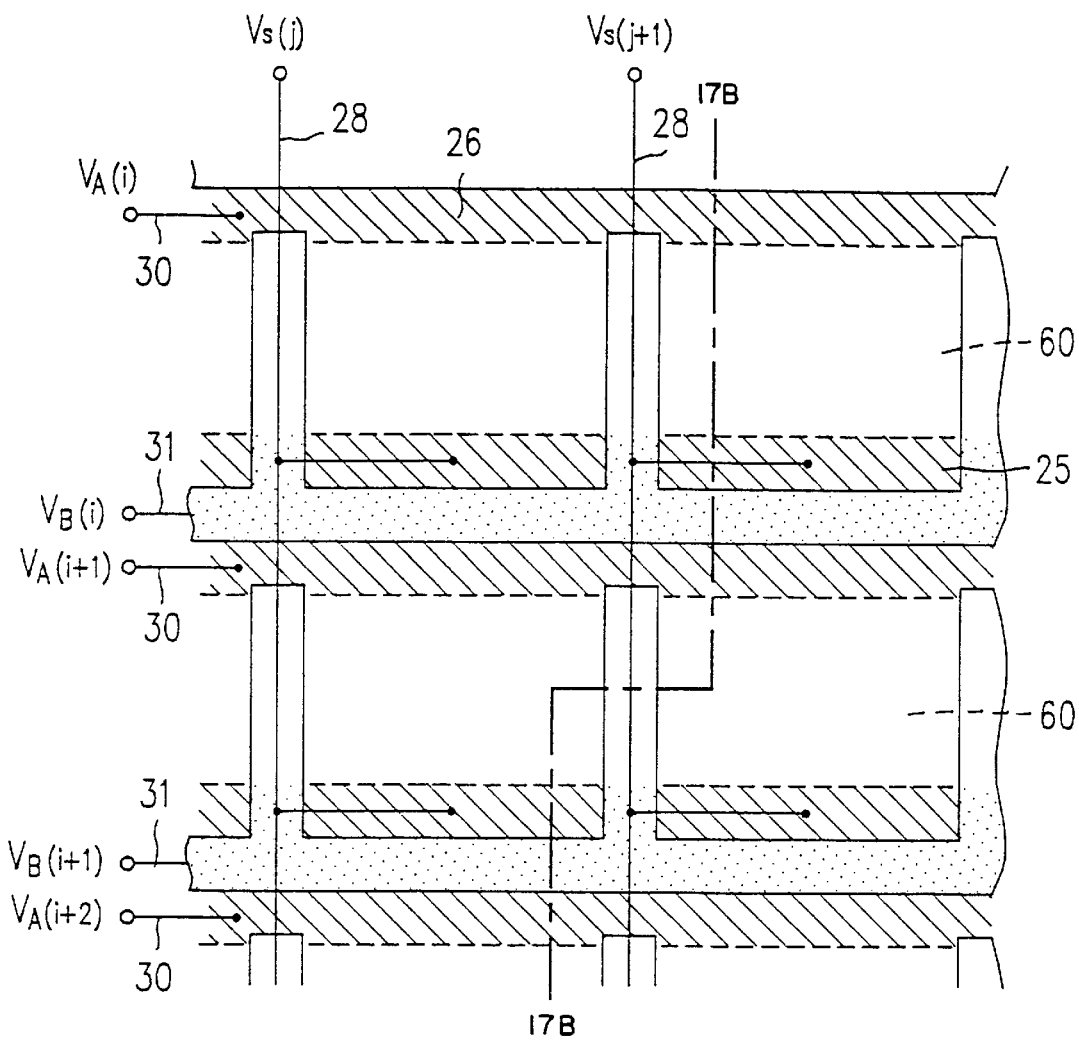
FIG. 17A is a plan view showing an example of the configuration of the two-dimensional image sensor using the active type solid-state imaging device of FIG. 14.
Figure 17B:
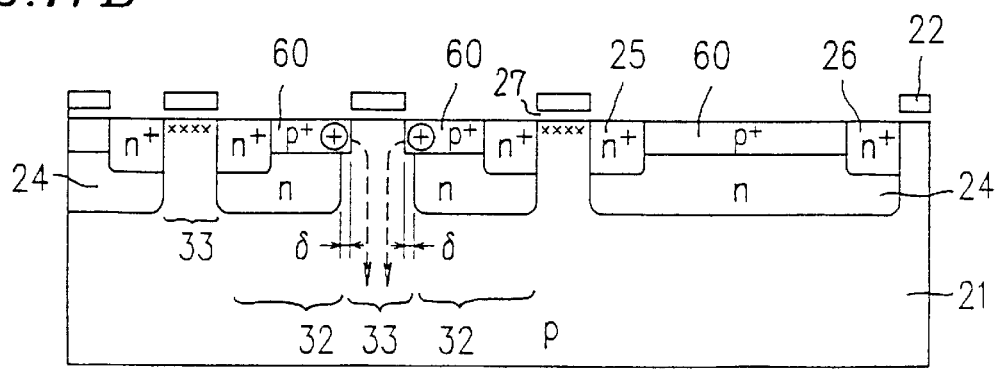
FIG. 17B is a cross-sectional view taken along the line 17B—17B in FIG. 17A.

FIGS. 17A and 17B show an example of the configuration of the two-dimensional image sensor using the active type photoelectric converting device of FIG. 14 or 15. FIG. 17A is a plan view of the pixel units of the active type photoelectric converting device and FIG. 17B is a cross-sectional view of the device taken along the line I—I in FIG. 17A. The junction gates 60 are the regions surrounded by the broken lines and are in an electrically floating state. The drain regions 26 are connected in common to the clock lines 30 denoted by $V_A(i)$, $V_A(i+1)$, etc. in a horizontal direction. The first gate regions 33 are connected in common to the clock lines 31 denoted by $V_B(i)$, $V_B(i+1)$, etc. in a horizontal direction so as to horizontally isolate the pixels. The source regions 25 are formed in the respective pixels so as to be opposed to the drain regions 26 interposing the junction gates 60 therebetween in a similar configuration to an ordinary FET.

And the source regions 25 are connected in common to the signal lines 28 denoted by $V_S(j)$, $V_S(j+1)$, etc. in a vertical direction. A low voltage is applied only to the horizontal drain regions 26 conducting a reading operation, therefore the current flows between the source regions 25 and the drain regions 26 only in the reading pixel portions. As a result, current signals in accordance with the signal charges accumulated in the pixels are conducted into the signal lines 28.

A p-impurity is implanted into the regions in the vicinity of the surface of the semiconductor (the regions indicated by crosses in FIG. 17B), i.e. the regions included in the first gate regions 33 and interposed between the source regions 25 and the drain regions 26 of the pixels vertically adjacent to the source regions 25 (the dotted regions in FIG. 17A). The reasons thereof will be described below.

At the time of the signal reading shown in FIG. 16B, in most cases, the surface potential $\phi_{i2}(S_1)$ of the first gate regions 33 is higher than the potential $\phi_D(L)$ of the drain regions 26. In such a case, the current flows between the source regions 25 and the drain regions 26 of the adjacent pixels, therefore, the signal charges to be read out no longer depends on the channel potential of the n-layer 24 under the junction gates 60. That is why the implantation of the p-impurity into the first gate regions 33 interposed between the source regions 25 and the drain regions 26 makes it possible to lower the surface potential to the potential $\phi_{i3}(s)$, which is lower than $V_D(L)$ as is shown by the broken line on the cross-sectional plane taken along the line B—B in FIG. 16B. As a consequence, the current no longer flows between the source regions 25 and the drain regions 26 via the first gate regions 33.

In the device of FIG. 17A and 17B, if the pixels are horizontally isolated by the first gate regions 33, the current may be mixed between the source regions 25 and the drain regions 26 of the horizontally adjacent pixels via the potential $\phi_{i2}(s_1)$ under the first gate regions 33 at the time of the signal accumulation. As is shown in FIG. 17B, a potential barrier can be formed in the channel of the n-layer 24 by isolating the borders of the n-layer 24 from the first gate regions 33 by a small distance 5, thereby preventing the mixing of the current between the adjacent pixels.

Figure 18:
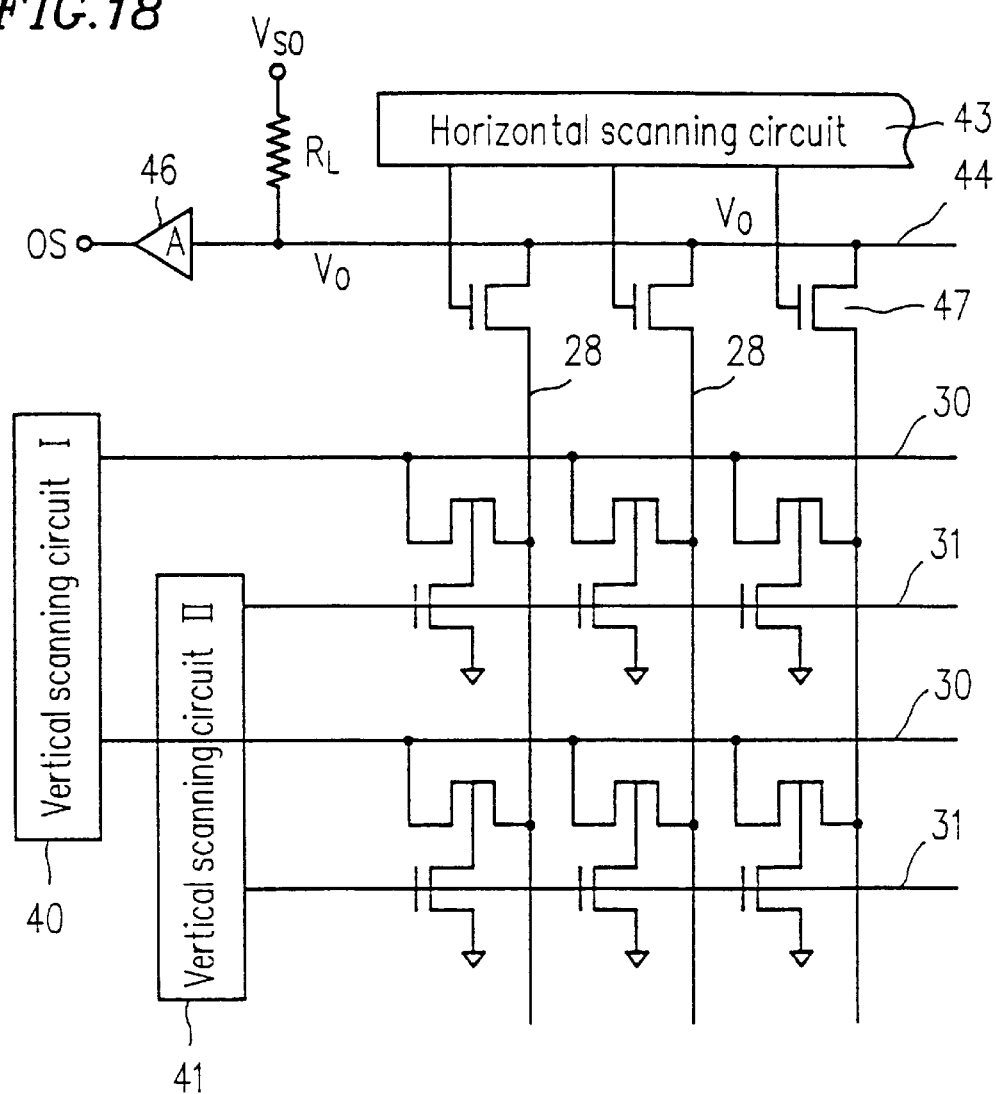
FIG. 18 is a circuit diagram showing an example of the two-dimensional image sensor using the active type solid-state imaging device of FIG. 14.

FIG. 18 shows an example of the configuration of the circuit for driving the two-dimensional image sensor shown in FIGS. 17A and 17B. The clock lines 30, denoted by $V_A(i)$, $V_A(i+1)$, etc. in FIG. 17A, are connected to the drain regions 26 and a first vertically scanning circuit 40. The clock lines 31, denoted by $V_B(i)$, $V_B(i+1)$, etc. in FIG. 17A, are connected to the first gate regions 33 and a second vertically scanning circuit 41. And the vertical signal lines 28, denoted by $V_S(j)$, $V_S(j+1)$, etc. in FIG. 17A, are respectively connected to the common signal line 44 denoted by $V_O$ via the MOSFET 47. The common signal line 44 is connected to the source $V_{SO}$ via the resistance $R_L$, converts the variation of the source current of the MOSFET 47 into the variation of the voltage, and then outputs the signal OS via the buffer amplifier 46. The respective values of the source $V_{SO}$ and the resistance $R_L$ are set so that the value of the voltage $V_O$ of the common signal line 44 may be higher than that of the channel potential $\phi_{i1}(m_1)$ of the n-layer 24.

The following Condition 3 is set so as to quantitatively analyze the above operation. This Condition 3 is the same as Condition 1 except for the $p^+$ layer 60.

[Condition 3]
Concentration of the substrate: $N_P=1.0\times10^{15}$ cm$^{-3}$
Concentration of the n-layer: $N_N=3.0\times10^{15}$ cm$^{-3}$
Concentration of the p$^+$ layer: $N_S=1.0\times10^{17}$ cm$^{-3}$
Thickness of the n-layer: $d_N=1.5$ μm
Thickness of the gate insulating film: $d_O=80$ nm And the thickness of the p$^+$ layer 60 may be 0.1 μm or more. The density of the signal charges $N_{sig}$ is set to be 0 cm$^{-2}$, the same value as that at the time of the resetting operation.

Figure 19:
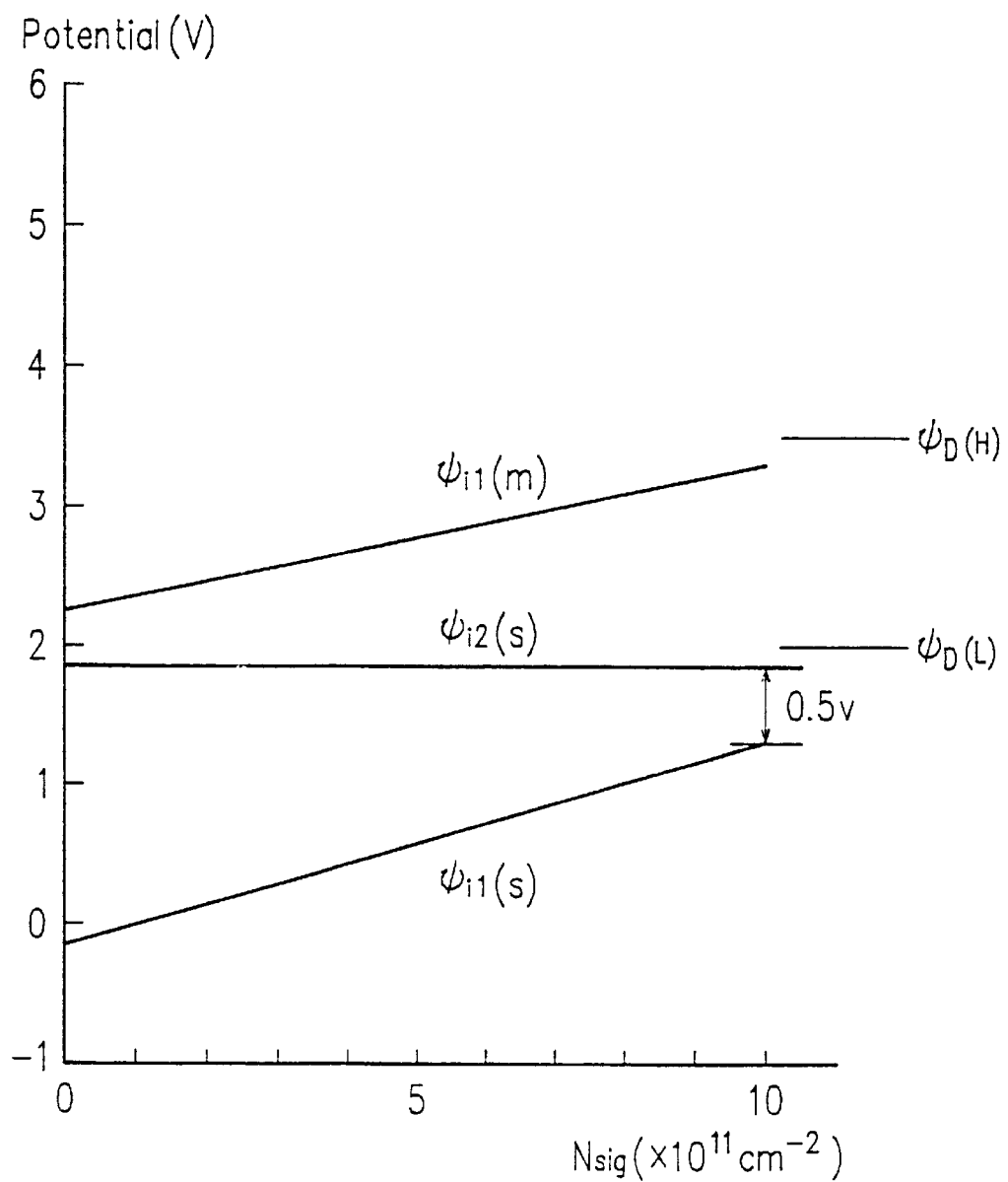
FIG. 19 is a graph showing the variations of the potentials in accordance with the amount of the signal charges in the operational state shown in FIGS. 16A and 16B.

FIG. 19 shows the variations of the potential $\phi_{i1}(m)$ of the n-layer 24 and the potential $\phi_{i1}(s)$ of the p$^+$ layer 60 in accordance with the variation of the density of the signal charges $N_{sig}$. As is shown in this figure, in accordance with the variation of the density of the signal charges $N_{sig}$ from 0 to $1\times10^{12}$ cm$^{-2}$, the potential $\phi_{i1}(m)$ varies from 2.29 to 3.30 V and the potential $\phi_{i1}(s)$ varies from –0.12 to 1.35 V. If the voltage $V_B(H)$ applied to the first gate electrodes 23 is 1.6 V, the potential $\phi_{i2}(s)$ is 1.86 V, thus the signal charges continue to be accumulated in the p$^+$ layer 60 until the density thereof reaches $1\times10^{12}$ cm$^{-2}$ and then overflow once the density exceeds the value. When the drain voltages $V_D(L)$ and $V_D(H)$ are 1.5 V and 3.0 V, respectively, the potentials $\phi_D(L)$ and $\phi_D(H)$ become 2.06 V and 3.56 V and the value of the potential $\phi_{i1}(m)$ is between these two values. Consequently, the current flows through only the pixels on the horizontal reading line.

Figure 20A:
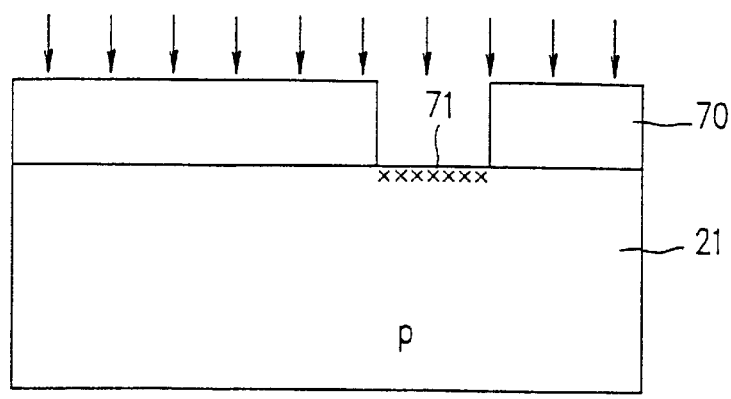
FIGS. 20A to 20D show an example of a method for producing the amplifying solid-state imaging device of FIG. 14.
Figure 20B:
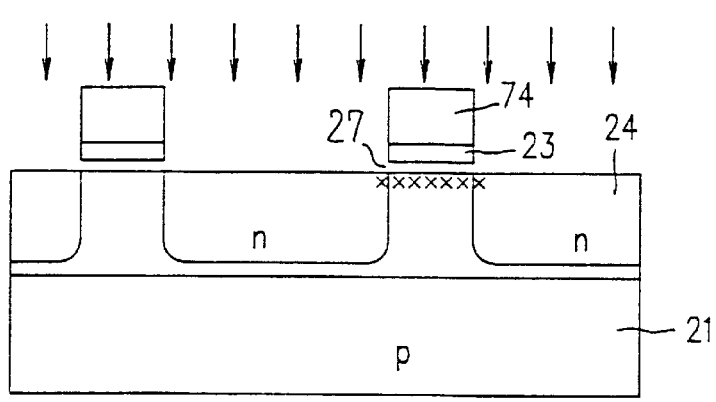

FIGS. 20A to 20D show an example of a method for producing the photoelectric converting device corresponding to that of FIGS. 17A and 17B when a junction gate FET is used for the photoelectric converting region. First, as is shown in FIG. 20A, the pattern of the photoresist 70 is formed on the p-substrate 21 and then the p-impurity layer 71, indicated by crosses in this figure, is formed by the ion implantation. Next, as is shown in FIG. 20B, the gate insulating film 27 is formed and then the first gate electrodes 23 are formed by using the photoresist 74 as a mask. Subsequently, the n-layer 24 is formed by the ion implantation of the n-impurity and using the first gate electrodes 23 and the photoresist 74 as a mask. The implantation energy of approximately 1.0 MeV is required so that the junction depth of the n-layer 24 is about $1.5\times10^{-4}$ cm of Condition 3. The n-layer 24 can be formed in a self-alignment manner by using the combined layer of the electrodes 23 and the photoresist 74 as a mask.

Figure 20C:
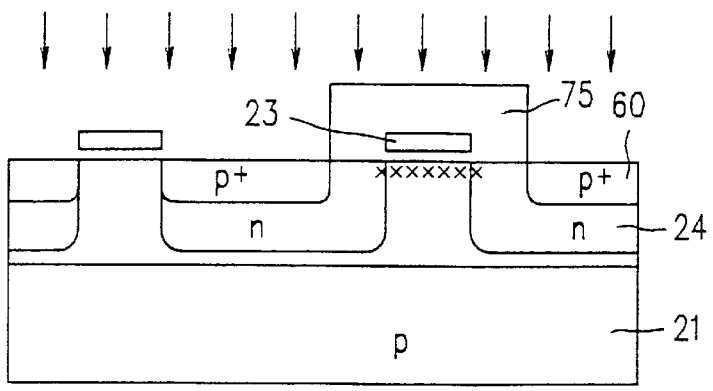
Figure 20D:
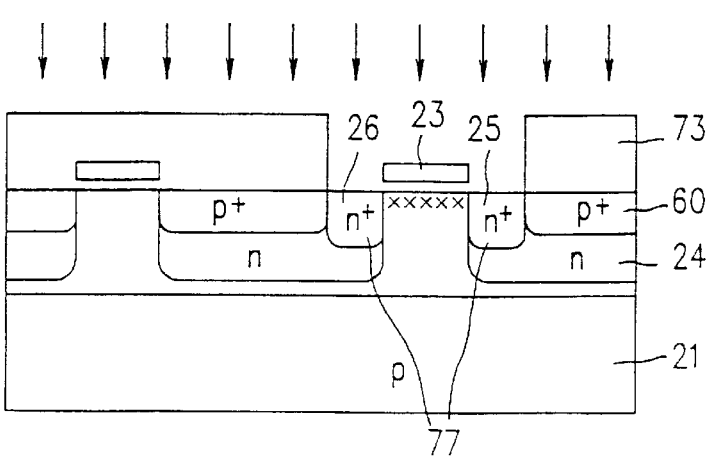
Figure 21:
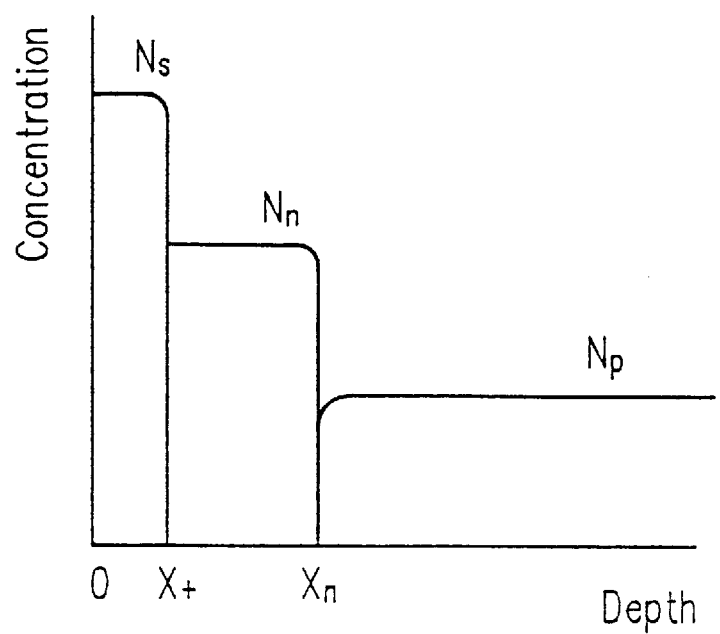
FIG. 21 is a graph showing a distribution of the concentration of the impurity in the semiconductor layer of the imaging device shown in FIGS. 20A to 20D.

After that, as is shown in FIG. 20C, the photoresist 74 is removed to form a new photoresist layer 75 and the p-layer in a high concentration 72 for the junction gates 60 is formed by the ion implantation and using the photoresist layer 75 and the first gate electrodes 23 as a mask. Finally, as is shown in FIG. 20D, the photoresist layer 73 is formed and the n-impurity in a high concentration is implanted or diffused by using the photoresist layer 73 and the electrodes 23 as a mask so as to form the n$^+$ region 77 for the source regions 25 and the drain regions 26. FIG. 21 shows the distribution of the concentration of the impurity on the cross-sectional plane of the junction gates 60 of FIG. 20D.

Hereinafter, further examples will be described. In the solid-state imaging device mentioned below, a numerical aperture showing the ratio between the area of the entire device and that contributing to the photoelectric conversion has been improved in order to increase the light-receiving sensitivity of the imaging device.

Figure 22A:
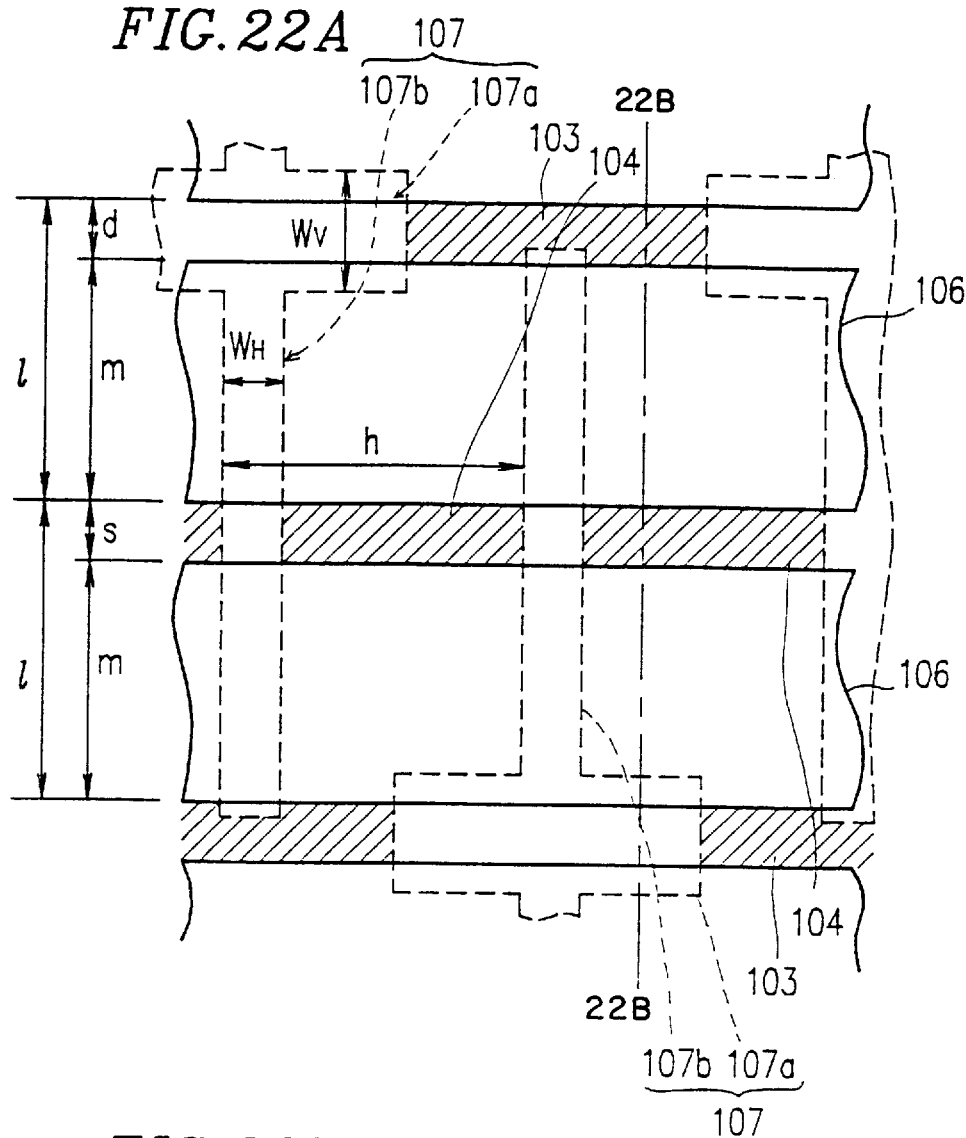
FIG. 22A is a plan view showing another two-dimensional image sensor using an active type solid-state imaging device of the present invention in which an aperture ratio is improved.
Figure 22B:
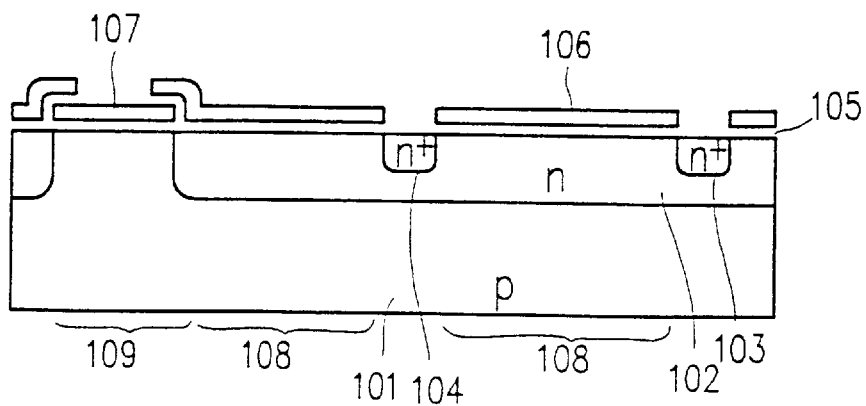
FIG. 22B is a cross-sectional view taken along the line 22B—22B in FIG. 22A.

FIG. 22A is a plan view of the solid-state imaging device having an improved numerical aperture, and FIG. 22B is a cross-sectional view taken along the line J—J in FIG. 22A. An n-layer 102 is formed on a p-type semiconductor substrate 101 and a drain region 103 and a source region 104 are formed in the n-layer 102. A second gate electrode 106 is formed on the n-layer 102 via an insulating film 105 between the drain region 103 and the source region 104. A first gate electrode 107 is formed adjacent to the second gate electrode 106 and on the p-type semiconductor substrate 101 via the insulating film 105. The region including the second gate electrode 106 and the semiconductor layer under the gate electrode 106 functions as a second gate region 108 and the region including the first gate electrode 107 and the semiconductor layer under the first electrode 107 functions as a first gate region 109. The second gate region 108, the drain region 103, and the source region 104 form an MOSFET.

The first gate electrode 107 consists of a base portion 107a and a branch portion 107b. The base portion 107a has the width $w_V$ in the vertical direction, and has the width h in the horizontal direction, which is equal to a pixel pitch. The branch portion 107b has the width $w_H$ in the horizontal direction. The first gate region 109 is also divided into a region corresponding to the base portion 107a and a region corresponding to the branch portion 107b. The region corresponding to the base portion 107a functions as a gate for flowing signal charges generated in the second gate region 108 into the inside of the p-type semiconductor substrate 101. The region corresponding to the branch portion 107b isolates pixels adjacent to each other in the horizontal direction.

FIG. 22A shows the four pixels having the respective FETs and consisting of two pairs of the two pixels arranged in a vertical direction and a horizontal direction, respectively. The source region 104 is shared by the two FETs vertically adjacent to each other and the drain region 103 is shared by the four pixels adjacent to each other in a vertical and a horizontal direction. The base portion 107a of the first gate electrode 107 is shared also by the four FETs, consisting of different ones from the four FETs sharing the drain region 103.

The horizontal arranged cycle of the region of the first gate region 109 corresponding to the base portion 107a and the drain region 103 is equal to the horizontal arranged cycle of the second gate region 108, but is shifted by one half of the cycles against that of the second gate region 108. The vertical arranged cycle of the region of the first gate region 109 corresponding the base portion 107a and the drain region 103 is shifted by ohe cycle against that of the horizontally adjacent region of the first gate region 109 corresponding the base portion 107a and drain region 103.

As is shown in FIG. 22A, the lengths in the vertical direction of the pixel pitch, the second gate region 108, the drain region 103, and the source region 104 are denoted by l, m, d, and s, respectively. In such a case, l is equal to d+m or s+m and each pixel only includes one of the source region 104 or the drain region 103 in the vertical direction. Thus, the second gate region 108 can occupy larger portion in the vertical direction.

For example, in the solid-state imaging device shown in FIG. 6A, if the lengths of the respective regions are the same in the vertical direction and are set as $k_1$, i.e. $s=d=g=k_1$, the numerical aperture in the vertical direction is $(1-3k_1)/1$.

On the other hand, in the imaging device of FIG. 22A, if the width $w_V$ of the base portion 107a is equal to d and s, and is set as $k_2$, the numerical aperture in the vertical direction is $(1-k_2)/1$. Accordingly, even if $w_V=k_2=2k_1$, in this imaging device, a higher numerical aperture is realized in the vertical direction than that of the device of FIG. 6A.

And if the pixel pitch in the horizontal direction is h, the numerical aperture in the horizontal direction is $(1-w_H)/h$.

The branch portion 107b has only to isolate the pixels in the horizontal direction, so the width $w_H$ in the horizontal direction may be shortened. On the contrary, in the device of FIGS. 6A and 6B, the width w in the horizontal direction of the first gate electrode 4 must be as long as the thickness of the n-layer 24, therefore the width w cannot be sufficiently shortened. Consequently, in the device of FIG. 22A, a higher numerical aperture can be realized in the horizontal direction than that of the device of FIG. 6A.

Figure 23:
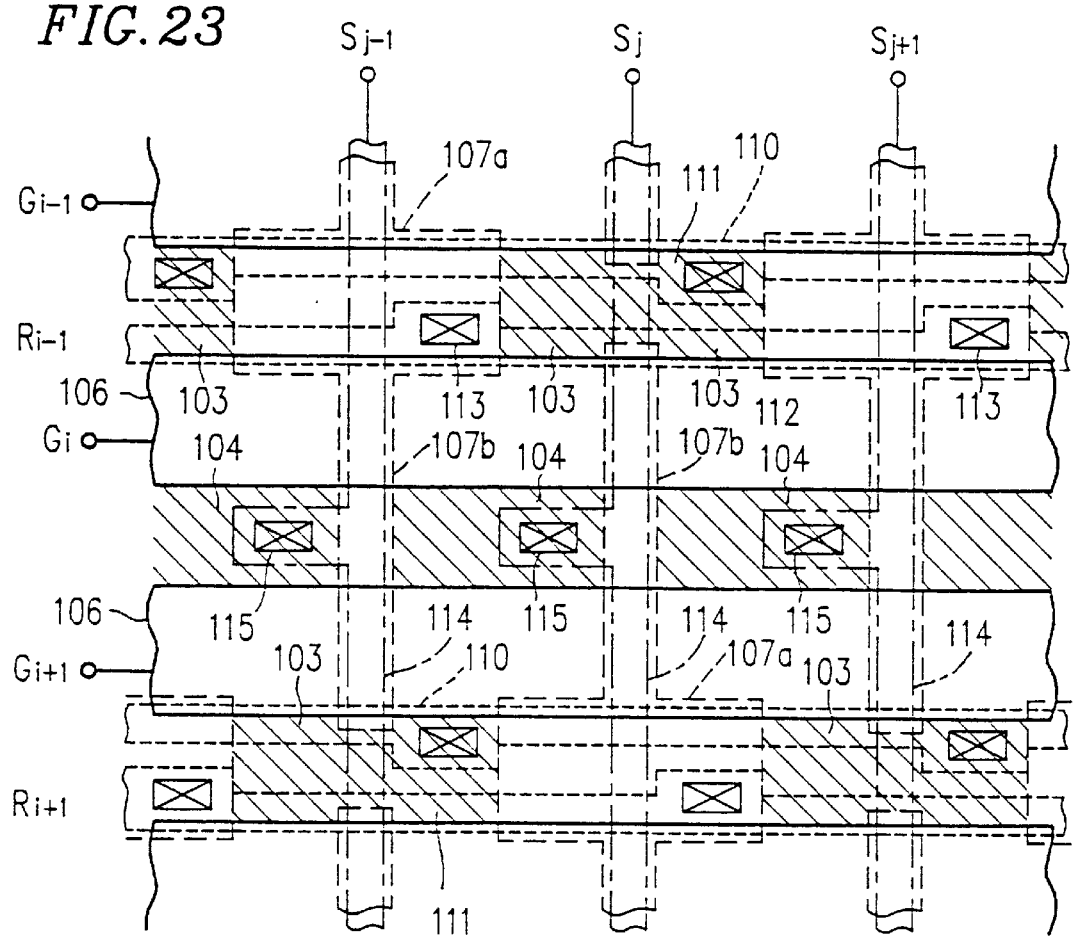
FIG. 23 is a plan view explaining wirings for connecting drain regions, source regions, and first gate electrodes, respectively in the image sensor shown in FIGS. 22A and 22B.

In the solid-state imaging device according to this example, the drain region 103, the source region 104, and the first gate electrode 106 are formed so that they are isolated from each other like islands, so the wiring is required to connect these regions and electrode. As is shown in FIG. 23, the drain regions 103 horizontally adjacent to each other are electrically connected to the wiring 110 via the contacts 111. The base portions 107a of the first gate electrodes 107 horizontally adjacent to each other are electrically connected to the wiring 112 via the contacts 113. The source regions 104 vertically adjacent to each other are electrically connected to the wiring 114 via the contacts 115. The wiring 114 and the wirings 110 and 112 form a double-layered wiring via the insulating film (not shown).

Next, the operations of the solid-state imaging device will be described with reference to FIGS. 23, 24, and 25A to 25C.

Figure 25A:
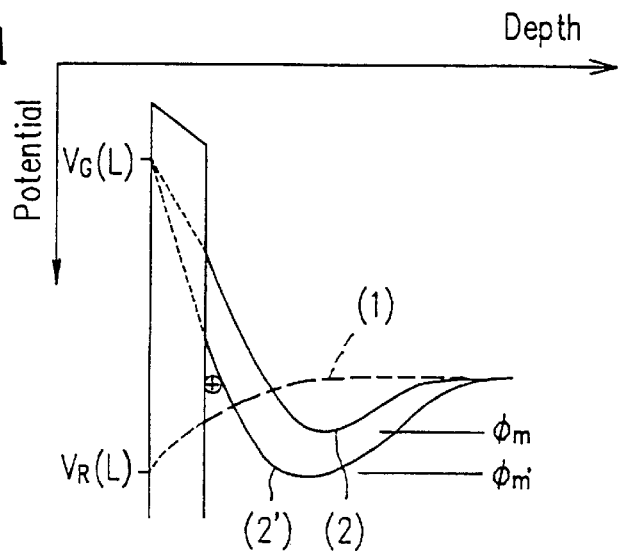
FIGS. 25A to 25C show potential distributions in a direction perpendicular to a semiconductor substrate in which the imaging device is formed, during an operation of the imaging device.

At the time of the signal charge accumulation, low voltages $V_G(L)$ and $V_R(L)$ are respectively applied to the second gate electrode 106 and the first gate electrode 107. As is shown in FIG. 25A, the signal charges (holes) are accumulated in the vicinity of the surface of the n-layer 102 under the second gate electrode 106 (FIG. 22B) by the potential barrier (1) generated under the first gate electrode 107 and the potential barrier (2) generated under the second gate electrode 106. After signal charges are accumulated, the potential barrier (2) becomes the potential barrier (2').

Figure 25B:
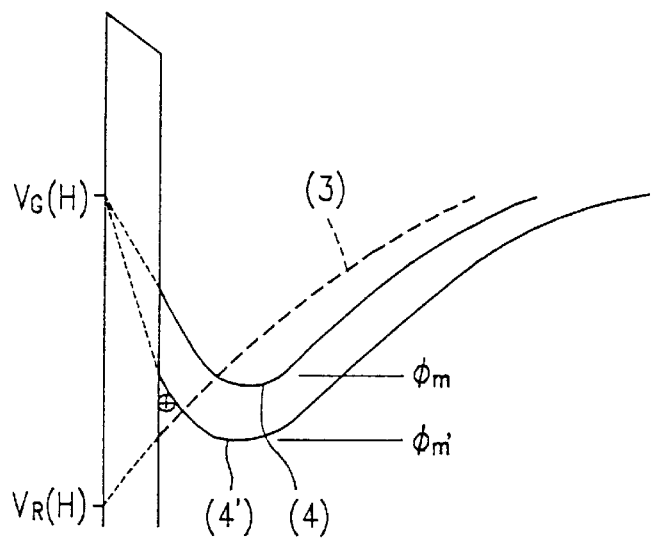

At the time of the signal charge reading, high voltages $V_G(H)$ and $V_R(H)$ are respectively applied to the second gate electrode 106 and the first gate electrode 107. Then, as is shown in FIG. 25B, the signal charges are accumulated in the vicinity of the surface of the n-layer 102 under the second gate electrode 106 (FIG. 22B) by the potential barrier (3) generated under the first gate electrode 107 and the potential barrier (4') generated by the second gate electrodes 106. The potential $\phi_m'$ of the potential barrier (4') generated under the second gate electrode 106 is higher than the potential $\phi_m'$ of the potential barrier (2') shown in FIG. 25A. The electrical characteristics between the source region 104 and the drain region 103 (FIG. 22B) are read out as pixel signals.

Then, if a low voltage $V_R(L)$ is applied to the first gate electrode 107, the potential barrier (1) is generated under the first gate electrode 107. since the potential barrier (1) is lower than the potential barrier (4'), the signal charges are discharged into the p-semiconductor substrate 101.

When the concentration of the impurity of Condition 1 is employed, appropriate voltages applied to the respective electrodes are: $V_G(L)=-3.0$ V; $V_R(L)=1.0$ V; $V_G(H)=0.0$ V; and $V_R(H)=5.0$ V.

Next, the driving timings of the solid-state imaging device will be described with reference to FIGS. 23 and 24. As shown in these figures, driving voltages $G_{i-1}$, $G_i$ and $G_{i+1}$ are applied to the second gate electrode 106, and voltages $R_{i-3}$ (a voltage applied to a first resetting gate which is positioned above these figures), $R_{i-1}$, and $R_{i+1}$ are applied to the first resetting gate 107.

When the signal charges accumulated under the second gate electrode 106 to which a driving voltage $G_i$ is applied are read out, high voltages are applied only to the second gate electrode 106 and the first gate electrode 107 to which driving voltages $R_{i-1}$ and $R_{i+1}'$. In this case, the potential under the second gate electrode 106 to which a driving voltage $G_i$ is applied is shown by FIG. 25B, while the potential under the other second gate electrodes 106 is shown by FIG. 25A. The source region 104 shown in FIG. 23 is shared by the second gate electrode 106 to which a driving voltage $G_i$ is applied and the second gate electrode 106 to which a driving voltage $G_{i+1}$ is applied and shows a potential value under the second gate electrode to which the driving voltage $G_i$ is applied. Thus, only the potential value under the second gate electrode 106 to which the highest voltage is applied is output to the wiring 114 connected to the source region 104. A potential barrier is also formed below the branch portion 107b by the high voltage applied to the first gate electrode 107 and isolates the pixels horizontally adjacent to each other. Since the drain region 103 has conventionally been used to isolate the pixels, the charges do not move among the four pixels sharing the drain region 103.

Figure 24:
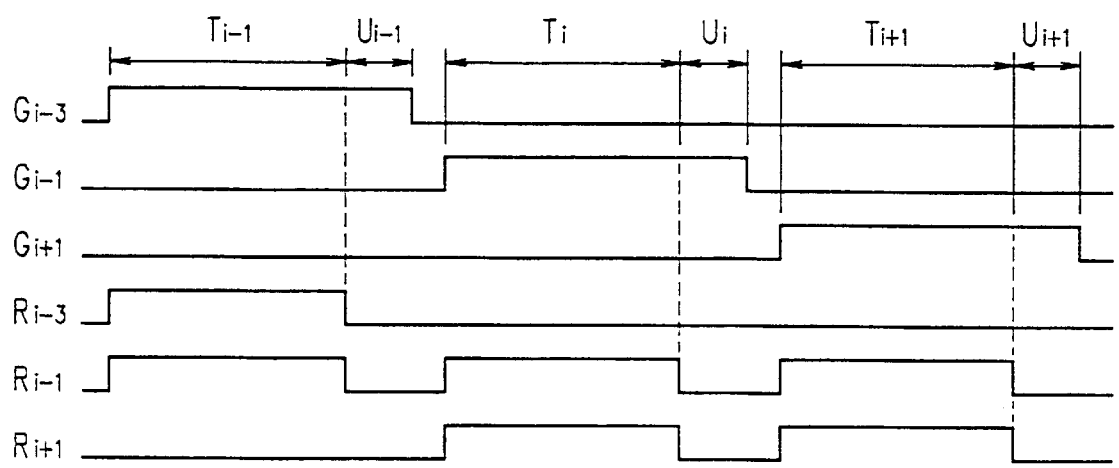
FIG. 24 is timing charts showing examples of the driving timings of the two-dimensional image sensor of FIGS. 22A and 22B.
Figure 25C:
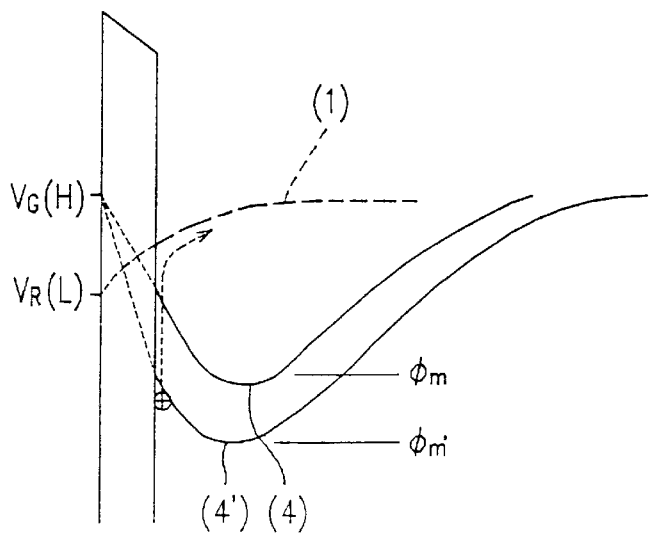

As shown in FIG. 24, in the case where the signal charges, accumulated under the second gate electrode 106 to which the driving voltage $G_i$ is applied, are discharged, a high voltage is applied only to the second gate electrode 106 to which the driving voltage $G_i$ is applied, and low voltages are applied to the other second gate electrodes 106 and all the first gate electrodes 107 during the period $U_i$. In such as case, the potential under the second gate electrode 106 to which the driving voltage $G_i$ is applied is shown by FIG. 25C. The accumulated signal charges are discharged into the p-type semiconductor substrate 101 (FIG. 22A) mainly via the region below the base portion 107a of the first gate electrode 107. Even if the first gate electrode 107 is shared by the adjacent pixels, the signal charges accumulated below the first gate electrode 107 are not discharged, because a low voltage is applied to the second gate electrode 106 to which the driving voltage $G_{i-1}$ is applied. The resetting operation is conducted simultaneously on the pixels horizontally adjacent to each other, so there is no problem if the first gate electrode 107 is shared by the pixels horizontally adjacent to each other.

In the same way as above, the accumulated signal charges are sequentially and repeatedly read out and discharged in the second gate electrode 106 to which the driving voltages $G_{i-1}$ and $G_{i+1}$ are applied. In the above-mentioned example, each signal reading period $T_i$ corresponds to a horizontal blanking period of a standardized TV. The period other than the signal reading period $T_i$ and the resetting period $U_i$ is applied for the signal accumulation, however, it may be applied for the resetting operation or other operations, e.g. the injection of the offset charges.

Another example will be described in which an MOSFET is used for the photoelectric converting FET.

Figure 26:
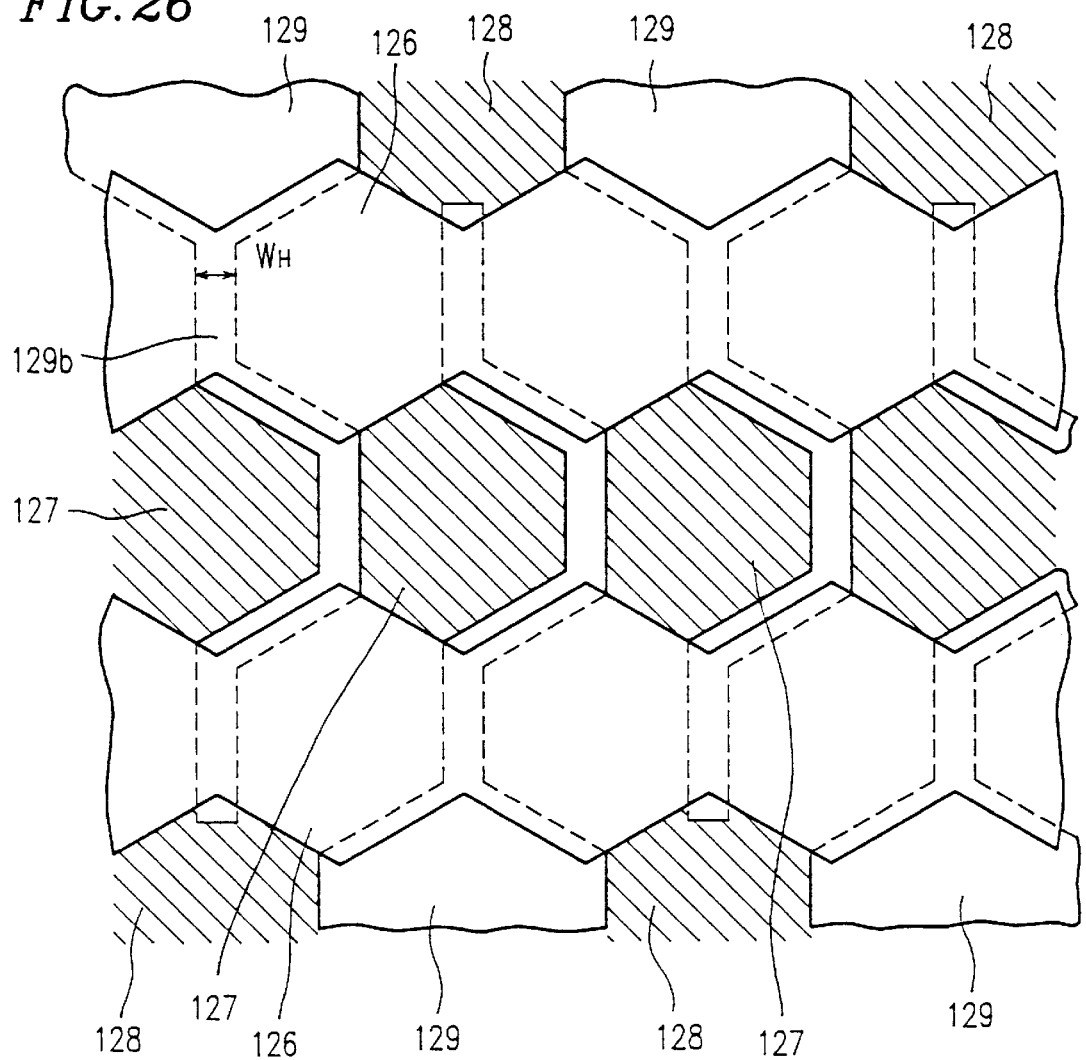
FIG. 26 is a plan view showing a variant example of the two-dimensional image sensor shown in FIGS. 22A and 22B, in which each pixel has a hexagonal shape.

As is shown in FIG. 26, in a solid-state imaging device according to this example, a first gate electrode 129, a second gate electrode 126, a source region 127, and a drain region 128 have a hexagonal shape as a constituting unit, respectively. Each of these elements is formed on the semiconductor substrate 125 or in the semiconductor substrate 125 so as to form a continuous pattern consisting of the respective unit. The structure in the semiconductor substrate 125 is same as that shown in FIG. 22B.

More specifically, the solid-state imaging device according to this example has the second electrodes 126 which consist of the horizontally connected hexagonal units above the semiconductor substrate 125. The second gate electrodes 126 create two kind of regions interposed therebetween. The source regions 127 locate one region and formed in the semiconductor substrate 125 so as to form continuously connected hexagonal units. The drain regions 128 locate the other region and formed in the semiconductor substrate so as to occupy every other hexagonal unit. The first gate electrodes 129 are formed over regions of the semiconductor substrate 125 which are interposed between the drain regions 128.

Each of the first gate electrodes 129 has a branch portion 129b extending in a vertical direction along edges of the hexagonal units. The branch portion has the width $W_H$ and formed under the second gate electrodes 126 via an insulating film (not shown) so as to across the two second gate electrode 126. The source regions 127 and the drain regions 128 are not formed under the first gate electrodes 129 and the branch portions 129b, therefore, the semiconductor substrate 125 remains as undoped regions.

N-layers (not shown) are formed in the semiconductor substrate 125 under the gate electrodes 129, the n-layers and the first gate electrodes constitute first gate regions. The second gate electrodes 126 and the region of semiconductor substrate 125 under the second gate electrodes 126 constitute second gate regions.

Each hexagonal unit of the second gate electrodes 126 functions as a gate electrode for an FET. Thus, each of the source regions 127 is shared by two FETs which have the two hexagonal units adjacently in the vertical direction. Moreover, each of the drain regions 128 is shared by four FETs which have four hexagonal units adjacently in the vertical direction and the horizontal direction.

Under such a configuration, all of the source regions 127, drain regions 128 and first gate electrodes 129 are in a hexagonal shape. Accordingly, the contacts for the wiring are more easily provided in order to connect the respective regions or the electrodes, as compared with the case of providing contact holes in elongate regions.

Still another example will be described in which a junction gate FET is used for the photoelectric converting FET.

Figure 27A:
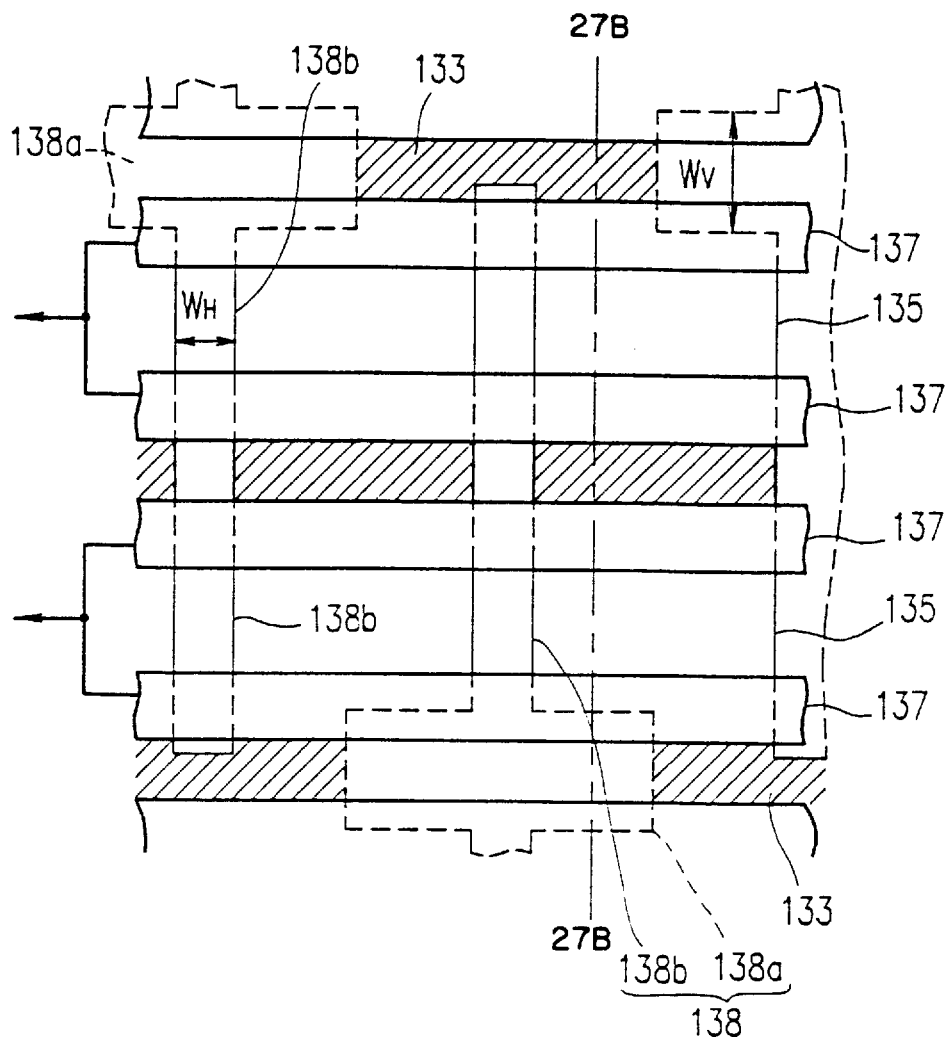
FIG. 27A is a plan view showing still another two-dimensional image sensor using an active type solid-state imaging device of the present invention in which an aperture ratio is improved.
Figure 27B:
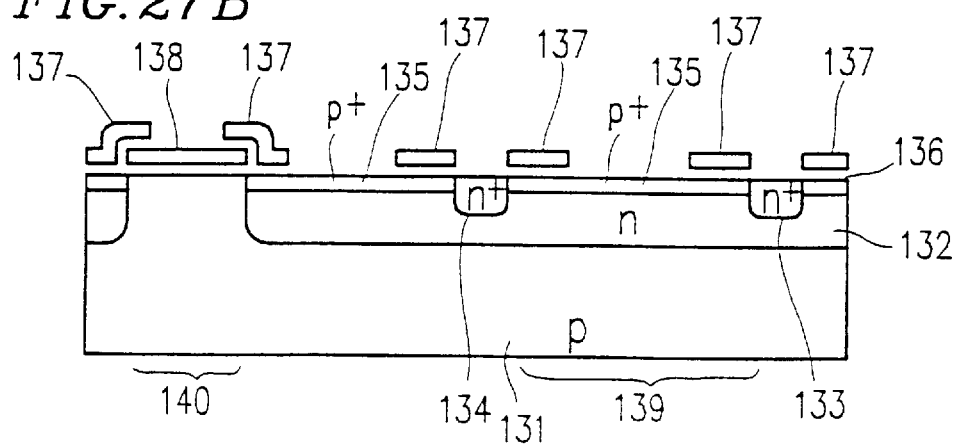
FIG. 27B is a cross-sectional view taken along the line 27B—27B in FIG. 27A.

FIG. 27A is a plan view of the solid-state imaging device according to this example, and FIG. 27B is a cross-sectional view taken along the line K—K in FIG. 27A. An n-layer 132 is formed in the surface region of a semiconductor substrate 131, and a drain region 133 and a source region 134 are further formed in the n-layer 132. A $p^+$ layer 135 is formed on the surface of the n-layer 132 between the drain region 133 and the source region 134. The second gate electrodes 137 are formed on the semiconductor substrate 131 via an insulating film 136 along the drain and the source regions 133 and 134. The first gate electrodes 138 are formed on the surface of the semiconductor substrate 131 via the insulating film 136.

The region including the $p^+$ layer 135 and the semiconductor layer below the layer 135 functions as a second gate region 139. The region including the first gate electrode 138 and the semiconductor layer below the electrode 138 functions as a first gate region 140. The second gate region 139, the drain region 133 and the source region 134 constitute a junction gate FET.

FIG. 27A shows four pixels including the respective FETs and consisting of two pairs of the two pixels arranged in a vertical direction and in a horizontal direction, respectively. The source region 134 is shared by the two FETs vertically adjacent to each other and the drain region 133 is shared by the four FETs adjacent to each other in a vertical direction and in a horizontal direction. The first gate electrode 138 is also shared by four FETs consisting of different pairs from those of the four FETs sharing the drain region 133. The first gate electrode 138 consists of the base portion 138a having a width $w_V$ in a vertical direction, and a branch portion 138b vertically extending from the base portion 138a and having a width $w_H$. The base portion 138a functions as a gate for making the charges generated in the second gate region 139 flow into the p-semiconductor substrate 131 and the branch portion 138b isolates the pixels horizontally adjacent to each other.

The region of the first gate region 140, including the branch portion 138b, isolates the pixels consisting of the two FETs horizontally adjacent to each other.

The second gate electrodes 137 are capacitively coupled to the $p^+$ layer 135 and varies the potential of the $p^+$ layer. The second gate electrode 137 is divided into two in one pixel so that the optical characteristics may be uniform and that the source region 134 and the drain region 133 may be formed in a self-alignment manner against the second gate electrode 137. The solid-state imaging device of FIGS. 27A and 27B is different from the imaging device of FIGS. 22A and 22B in that the signal charges are accumulated in the $p^+$ layer 135. When the signal charges are accumulated in the $p^+$ layer 135, the exposed junction gate prevents the light from being absorbed by the gate electrodes, thereby obtaining a high sensitivity.

Figure 28:
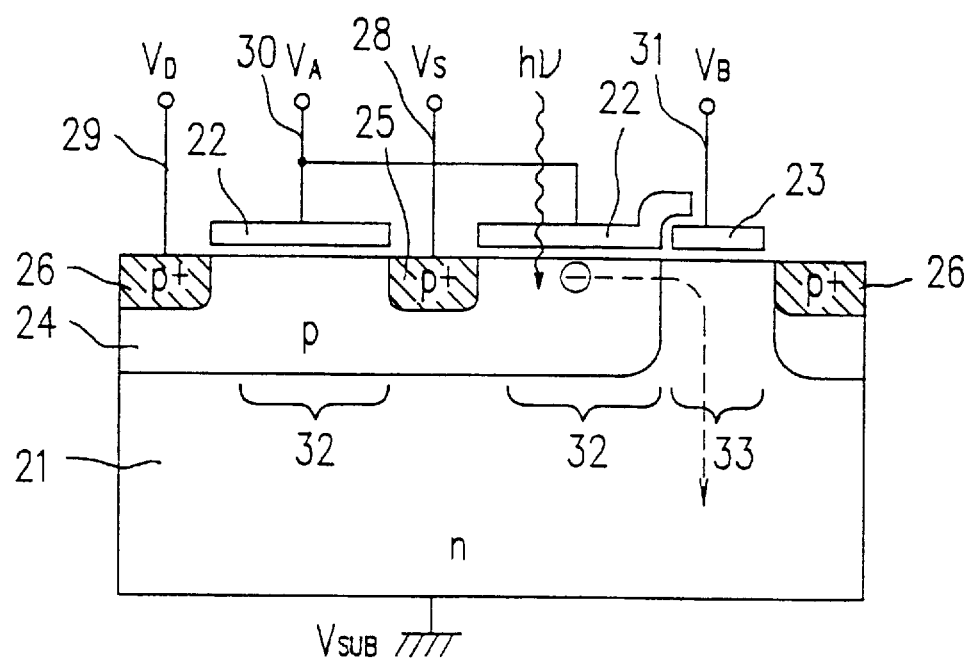
FIGS. 28 to 31 show other examples of amfactive typesolid-state imaging devices which have the other conductivity type for a channel of an FET against the devices shown in FIGS. 1, 22B, 14, and 27B, respectively.
Figure 29:
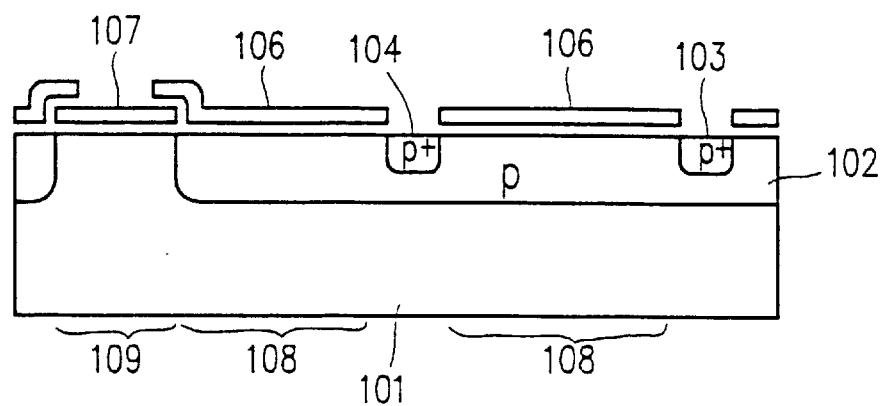
Figure 30:
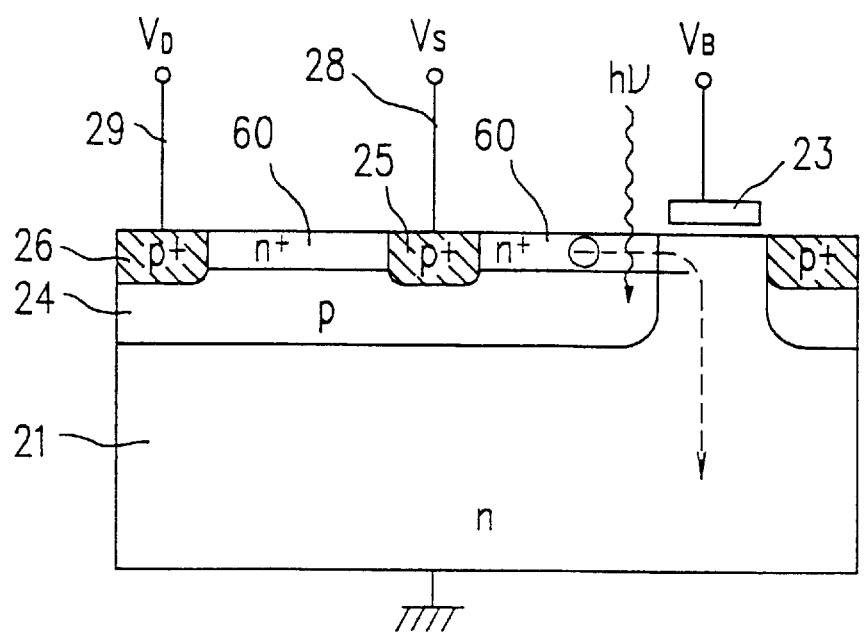
Figure 31:
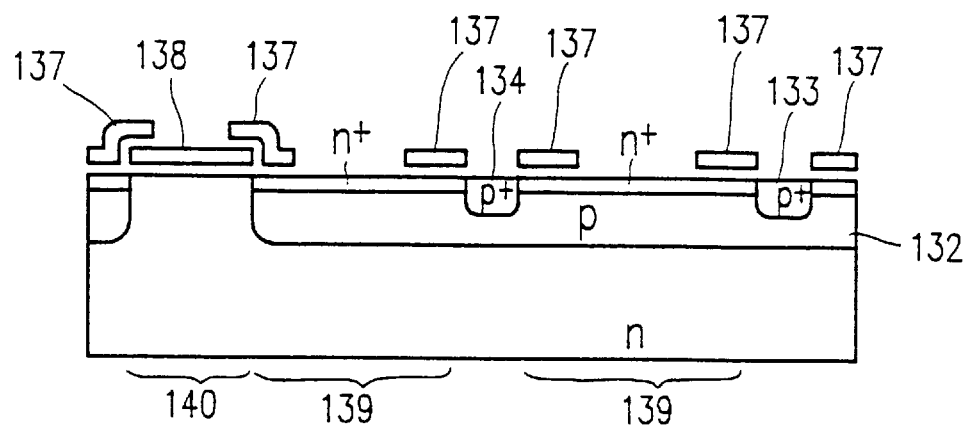
Figure 32A:
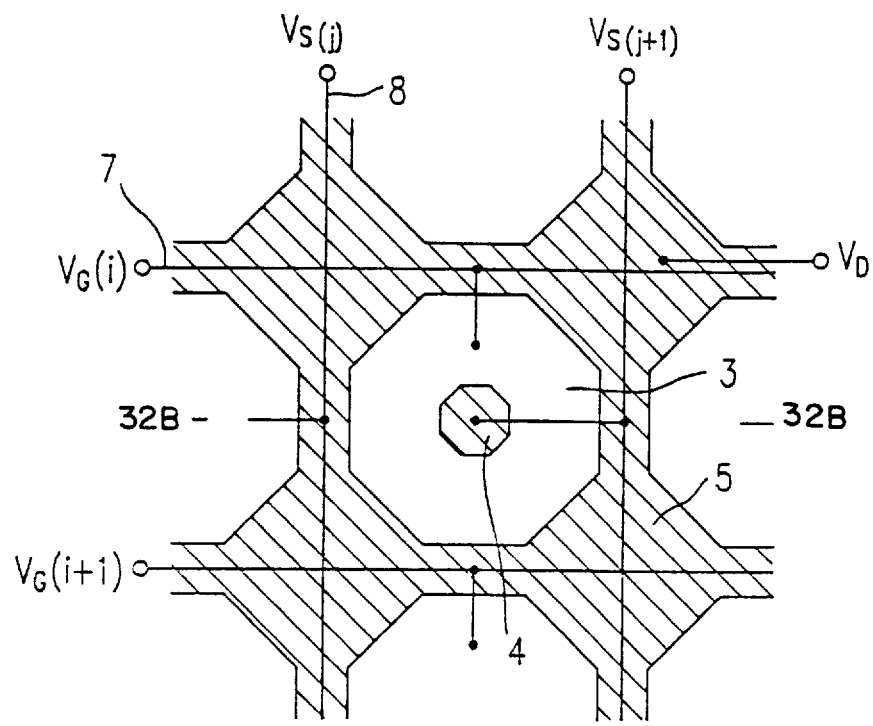
FIG. 32A is a plan view showing a conventional CMD type active type solid-state imaging device.
Figure 32B:
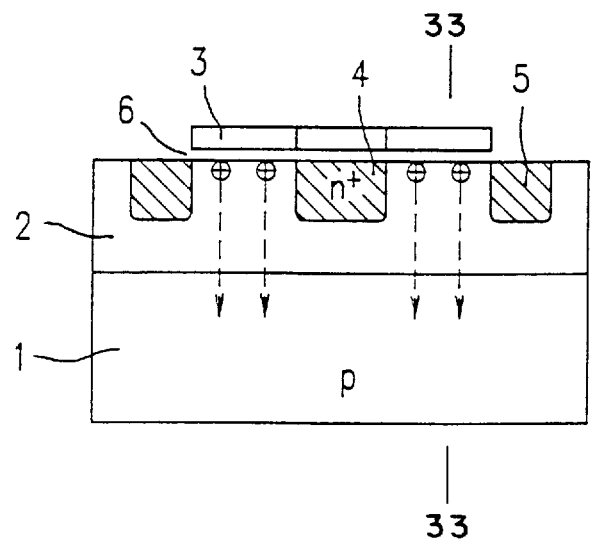
FIG. 32B is a cross-sectional view taken along the line 32B—32B in FIG. 32A.
Figure 33:
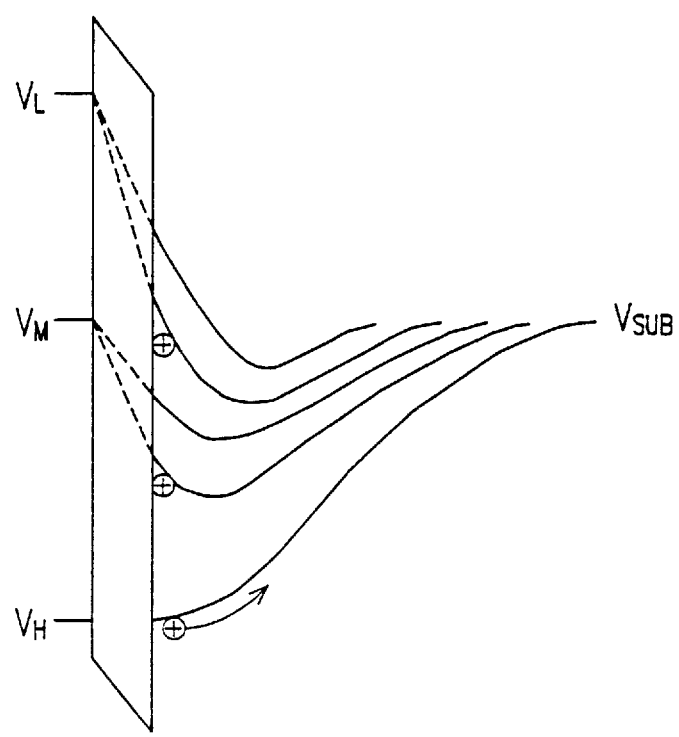
FIG. 33 shows potential distributions in a direction along the line M—M in FIG. 32B.
Figure 34A:
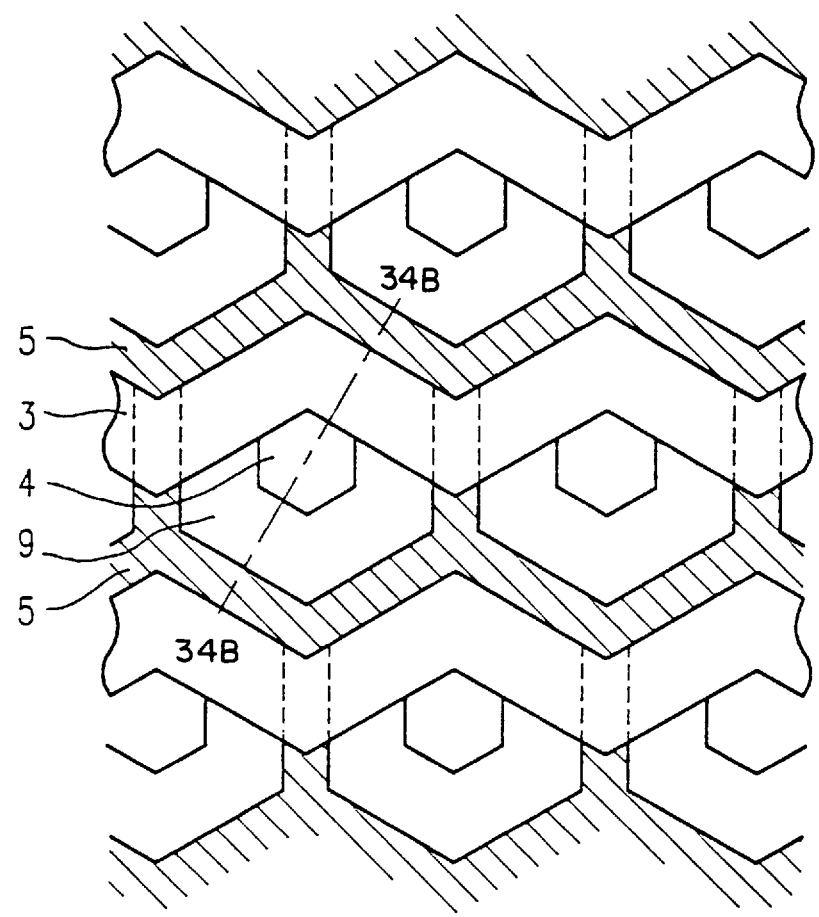
FIG. 34A is a plan view showing a conventional FGA type active type solid-state imaging device.
Figure 34B:
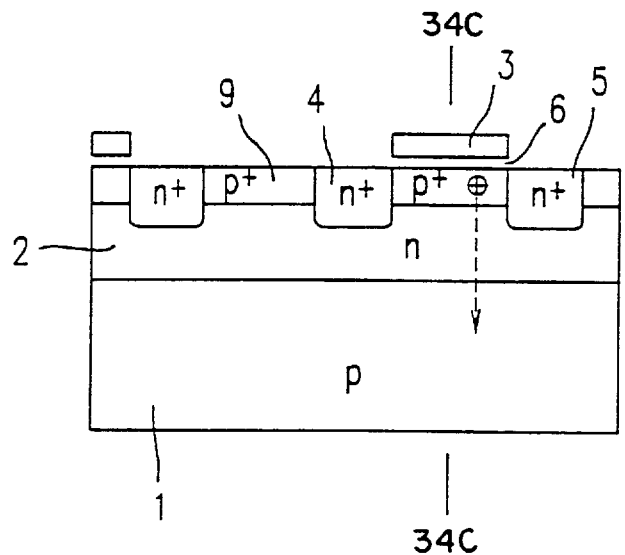
FIG. 34B is a cross-sectional view taken along the line 34B—34B in FIG. 34A.
Figure 34C:
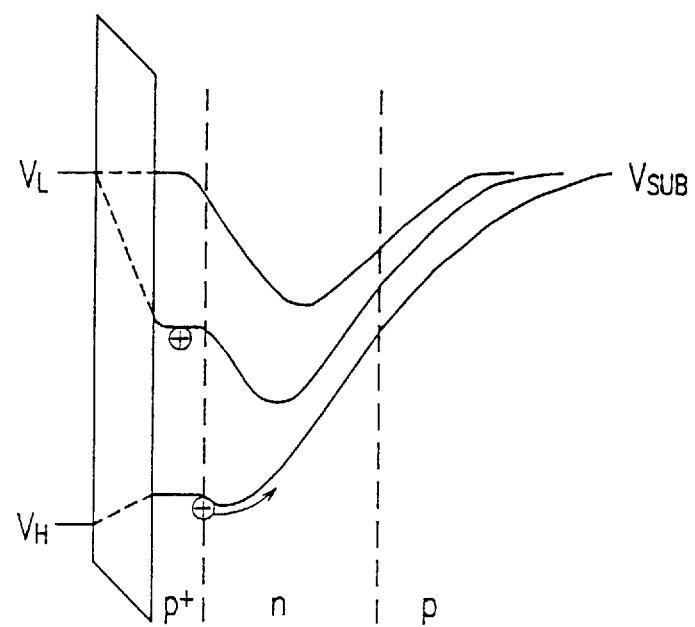
FIG. 34C shows potential distributions in a direction along the line 34C—34C in FIG. 34B.
Figure 35A:
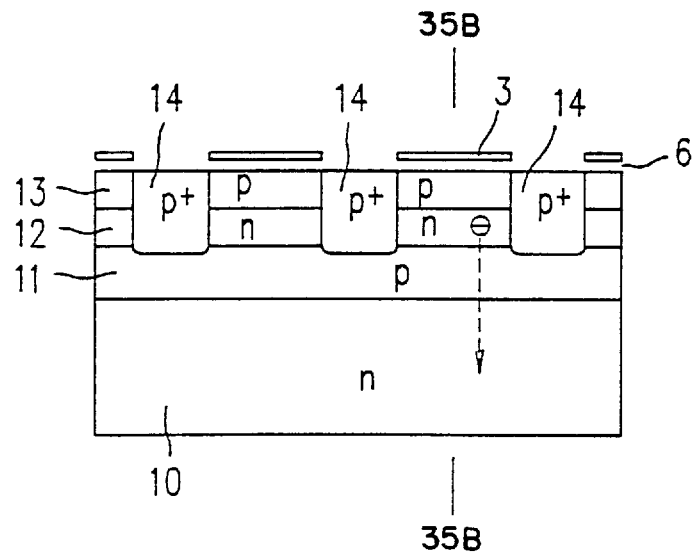
FIG. 35A is a cross-sectional view showing a conventional BCMD type active type solid-state imaging device.
Figure 35B:
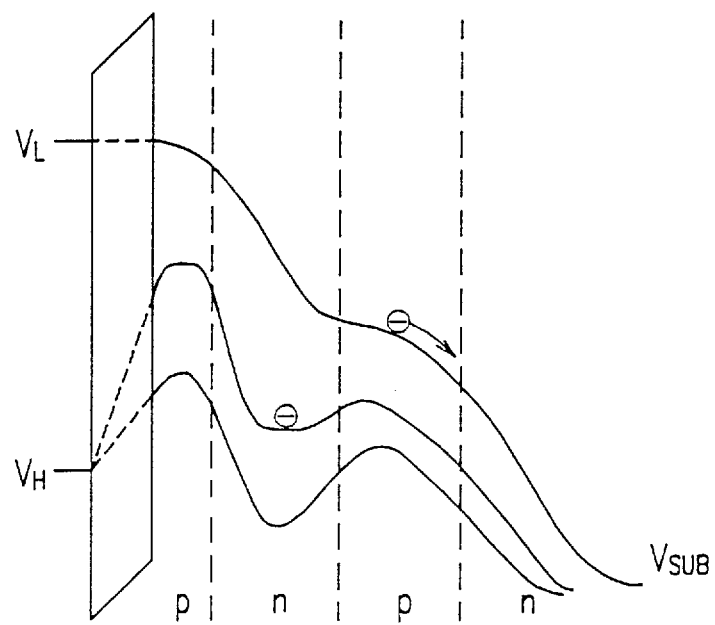
FIG. 35B shows potential distributions in a direction along the line 35B—35B in FIG. 35A.

In the above-mentioned examples, the present invention has been described according to the case where the transistor for the photoelectric converting region is an n-channel FET and the signal charges accumulated in the vicinity of the surface of the semiconductor are holes. However, the present invention is not limited thereto, but can also be described if all the polarities are reversed. FIGS. 28 and 29 show a case where the transistor for the photoelectric converting region is a p-channel MOSFET and FIGS. 30 and 31 show a case where the transistor is a p-channel junction gate FET. Under the configuration of the active type photoelectric converting device and the active type solid-state imaging device of FIGS. 28 and 29, the conductivity type of the semiconductor is reversed to that of the active type photoelectric converting device of FIG. 1 and the solid-state imaging device of FIGS. 22A and 22B, using the configuration thereof. And under the configuration of the active type photoelectric converting device of FIG. 30 and the solid-state imaging device of FIG. 31, the conductivity type of the semiconductor is reversed to that of the active type photoelectric converting device of FIG. 14 and the solid-state imaging device of FIGS. 27A and 27B, using the configuration thereof. Accordingly, the configurations and the driving methods of these two devices can be easily understood from the description of the above-mentioned examples.

Consequently, in the case where the active type photoelectric converting devices according to these two examples are used, similar effects can be obtained to those described in the above-mentioned examples.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active type photoelectric converting device comprising:
   a transistor formed in a surface region of a semiconductor body, the transistor accumulating signal charges generated by light incident on the transistor at a surface of the semiconductor body, and outputting variation of an electric signal during an outputting period in response to variation of the accumulated signal charges which are not transferred from the surface of the semiconductor body during the outputting period; and a first gate region including a portion of the semiconductor body, a first insulating film formed on the portion of the semiconductor body, and a first gate electrode formed on the first insulating film;

wherein the first gate region is provided adjacent to the transistor, for transferring the accumulated signal charges after the outputting period from the surface of the semiconductor body into an inside of the semiconductor body in response to a voltage applied to the first gate electrode.

2. An active type photoelectric converting device according to claim 1, wherein the transistor is an MOSFET including a second gate region which has a buried channel structure, and the first gate region having a surface channel structure.

3. An active type photoelectric converting device according to claim 1, wherein the transistor is a junction gate type FET including a second gate region which has a buried channel structure, and the first gate region having a surface channel structure.

4. An active type photoelectric converting device according to claim 2, wherein the semiconductor body has a first conductivity type, and the transistor comprises:

a first semiconductor layer of a second conductivity type provided in the surface region of the semiconductor body, the first semiconductor layer including a signal accumulating region for accumulating the signal charges and a channel region serving as a channel for the transistor;

a second semiconductor layer and a third semiconductor layer, both provided in a surface region of the first semiconductor layer, the second semiconductor layer and the third semiconductor layer including an impurity of the second conductivity type in a higher concentration than that of the first semiconductor layer, and acting as a source and a drain for the transistor;

a second insulating film provided on the first semiconductor layer; and a second gate electrode provided on the second insulating film, whereby the second gate region comprises the first semiconductor layer, the second insulating film, and the second gate electrode.

5. An active type photoelectric converting device according to claim 3, wherein the semiconductor body has a first conductivity type, and the transistor comprises:

a first semiconductor layer of a second conductivity type provided in the semiconductor body, the first semiconductor layer including a channel region serving as a channel for the transistor;

a second semiconductor layer and a third semiconductor layer, both provided in a surface region of the first semiconductor layer, the second semiconductor layer and the third semiconductor layer including an impurity of the second conductivity type in a higher concentration than that of the first semiconductor layer and acting as a source and a drain for the transistor; and a fourth semiconductor layer of the first conductivity type provided on the first semiconductor layer, the fourth semiconductor layer including a signal charge accumulating region for accumulating the signal charges, whereby the second gate region comprises the first and the fourth semiconductor layers.

6. An active type photoelectric converting device according to claim 5, wherein the transistor further comprises a third insulating film provided on the fourth semiconductor layer, and a second gate electrode provided on the third insulating film.

7. An active type photoelectric converting device according to claim 1, wherein a resetting operation of the signal charges of the device is accomplished by controlling at least the voltage applied to the first gate electrode, and discharging the signal charges accumulated in the surface region of the semiconductor body in the transistor into the inside of the semiconductor body via the first gate region.

8. An active type photoelectric converting device according to claim 1, wherein, in a case where excessive signal charges of more than a predetermined amount are accumulated in the surface region of the semiconductor body in the transistor, a blooming suppression operation of the device is accomplished by controlling at least the voltage applied to the first gate electrode and discharging the excessive signal charges into the semiconductor body via the first gate region.

9. An active type photoelectric converting device according to claim 1, wherein an offset adding operation of the device is accomplished by controlling at least the voltage applied to the first gate electrode, and injecting offset charges from the inside of the semiconductor body into the surface region of the semiconductor body in the transistor via the first gate region.

10. An active type photoelectric converting device according to claim 9, wherein a differential signal is output by subtracting an output signal of a sum of the injected offset charges and the charges accumulated in the surface region of the semiconductor body in the transistor by a photoelectric conversion from an output signal of the injected offset charges alone.

11. An active type photoelectric converting device according to claim 7, wherein a duration of the signal charge accumulation is controlled in accordance with timings of the resetting operation of the signal charges of the device, and the timings is determined by controlling a voltage applied to the first gate electrode or voltages applied to the first gate electrode and a second gate electrode.

12. A solid-state imaging device comprising a plurality of active type photoelectric converting devices arranged in a surface region of a semiconductor body in one dimensional array or two dimensional array, each of the active type photoelectric converting device comprising:

a transistor formed in the surface region of the semiconductor body, the transistor accumulating signal charges generated by light incident on the transistor at a surface of the semiconductor body, and outputting variation of an electric signal during an outputting period in response to variation of the accumulated signal charges which are not transferred from the surface of the semiconductor body during the outputting period; and a first gate region including a portion of the semiconductor body, a first insulating film formed on the portion of the semiconductor body, and a first gate electrode formed on the first insulating film;

wherein the first gate region is provided adjacent to the transistor; for transferring the accumulated signal charges after the outputting period from the surface of the semiconductor body into an inside of the semiconductor body in response to a voltage applied to the first gate electrode.

13. A solid-state imaging device according to claim 12, wherein in each of the active type photoelectric converting devices;

the first gate region has a surface channel structure, and the transistor is a field effect transistor and includes a second gate region provided adjacent to the first gate region and having a buried channel structure, a source region, and a drain region, and wherein the second gate region is surrounded by the drain region and the first gate region, and each of the active type photoelectric converting devices is isolated from adjacent ones by at least one of the drain region and the first gate region.

14. A solid-state imaging device according to claim 12, wherein the plurality of the active type photoelectric converting devices are arranged in an array along a first direction, wherein in each of the active type photoelectric converting devices;

the first gate region has a surface channel structure, the transistor is a field effect transistor and includes a second gate region provided adjacent to the first gate region and having a buried channel structure, a source region and a drain region, the transistor shares the source region with a transistor of a first active type photoelectric converting device adjacent to the active type photoelectric converting devices in a side, and shares the drain region and the first gate region with a transistor of a second active type photoelectric converting device adjacent to the active type photoelectric converting devices in the other side.

15. A solid-state imaging device according to claim 14, wherein the plurality of the active type photoelectric converting devices are arranged in a two dimensional array along the first and a second direction, and wherein the drain region is further shared with a transistor of an active type photoelectric converting device in a side adjacent to the active type photoelectric converting device in the second direction and with a transistor of an active type photoelectric converting device in the side adjacent to the second active type photoelectric converting device, and wherein the first gate region is further shared with a transistor of an active type photoelectric converting device in the other side adjacent to the active type photoelectric converting device in the second direction and with a transistor of an active type photoelectric converting device in the other side adjacent to the second active type photoelectric converting device.

16. A solid-state imaging device according to claim 12, wherein the plurality of the active type photoelectric converting devices is MOSFETS, respectively.

17. A solid-state imaging device according to claim 12, wherein the plurality of the active type photoelectric converting devices is junction gate FETS, respectively.

18. A solid-state imaging device according to claim 16, wherein the semiconductor body has a first conductivity type, wherein the first gate region includes a portion of the semiconductor body, a first insulating film formed on the portion of the semiconductor body, and a first gate electrode formed on the first insulating film, and wherein the transistor includes a first semiconductor layer of a second conductivity type, provided adjacent to the first gate region in the surface region of the semiconductor body, the source region and the drain region are formed in the first semiconductor layer the second gate region includes a portion of the first semiconductor layer, a second gate insulating film formed on the portion of the first semiconductor layer, and a second gate electrode formed on the second gate insulating film.

19. A solid-state imaging device according to claim 17, wherein the semiconductor body has a first conductivity type, wherein the first gate region includes a portion of the semiconductor body, a first insulating film formed on the portion of the semiconductor body, and a first gate electrode formed on the first insulating film, wherein the transistor includes a first semiconductor layer of a second conductivity type, provided adjacent to the first gate region in the surface region of the semiconductor body, a second and a third semiconductor layer formed in a surface region of the first semiconductor layer and acting as a source region and the drain region, respectively, and wherein the second gate region includes a portion of the first semiconductor layer and a fourth semiconductor layer of the first conductivity type, provided in a portion of the first semiconductor layer.

20. A solid-state imaging device according to claim 19, wherein the transistor further includes a third insulating film formed on the fourth semiconductor layer and a second gate electrode formed on the third insulating film.

21. A solid-state imaging device according to claim 20, wherein the second gate electrode have a first subelectrode formed along the second semiconductor layer and a second sub-electrode formed along the third semiconductor layer.

22. A solid-state imaging device according to claim 18, further comprising:

first clock lines for electrically connecting the respective first gate electrodes of the plurality of the active type photoelectric converting devices;

second clock lines for electrically connecting the respective second gate electrodes of the plurality of the active type photoelectric converting devices; and signal lines for electrically connecting the respective second semiconductor layers of the plurality of the active type photoelectric converting devices, wherein a prescribed voltage is applied to the respective third semiconductor layers of the plurality of the amfactive typephotoelectric converting devices.

23. A solid-state imaging device according to claim 19, further comprising:

first clock lines for electrically connecting the respective first gate electrodes of the plurality of the active type photoelectric converting devices;

second clock lines for electrically connecting the respective third semiconductor layers of the plurality of the active type photoelectric converting devices; and signal lines for electrically connecting the respective second semiconductor layers of the plurality of the active type photoelectric converting devices.

24. A solid-state imaging device according to claim 15, wherein the first gate region of each of the active type photoelectric converting devices has a base portion and a branch portion extending from the base portion along the first direction, the source region and the second gate region are respectively isolated by the branch portion from those of the adjacent active type photoelectric converting device in the second direction.

25. A solid-state imaging device according to claim 24, wherein the base portion of the first gate electrode is interposed between the drain regions of two adjacent active type photoelectric converting devices in the second direction, and an arranged section of the base portion and the drain region is shifted by a half of the length of the section to that of the second gate region in the second direction.

26. A solid-state imaging device according to claim 24, wherein an arranged section of the base portion and the drain region in the second direction is shifted by one length of the section to that of the base portion and the drain region of the adjacent active type photoelectric converting device in the first direction.

27. A solid-state imaging device according to claim 15, wherein the first gate electrode, the drain region, and the second gate electrode of each of the active type photoelectric converting devices are electrically connected to the respective ones of the adjacent active type photoelectric converting device in the second direction, and the source region is electrically connected to that of the adjacent active type photoelectric converting device in the first direction.

* * * * *